United States Patent
Alfadhel et al.

(10) Patent No.: US 10,768,058 B2
(45) Date of Patent: Sep. 8, 2020

(54) MAGNETIC NANOCOMPOSITE SENSOR

(71) Applicant: KING ABDULLAH UNIVERSITY OF SCIENCE AND TECHNOLOGY, Thuwal (SA)

(72) Inventors: Ahmed Alfadhel, Thuwal (SA); Bodong Li, Thuwal (SA); Jurgen Kosel, Thuwal (SA)

(73) Assignee: KING ABDULLAH UNIVERSITY OF SCIENCE AND TECHNOLOGY, Thuwal (SA)

( * ) Notice: Subject to any disclaimer, the term of this patent is extended or adjusted under 35 U.S.C. 154(b) by 277 days.

(21) Appl. No.: 15/522,080

(22) PCT Filed: Oct. 27, 2015

(86) PCT No.: PCT/IB2015/058274
§ 371 (c)(1),
(2) Date: Apr. 26, 2017

(87) PCT Pub. No.: WO2016/067197
PCT Pub. Date: May 6, 2016

(65) Prior Publication Data
US 2017/0336272 A1  Nov. 23, 2017

Related U.S. Application Data

(60) Provisional application No. 62/073,160, filed on Oct. 31, 2014.

(51) Int. Cl.
*G01L 1/12* (2006.01)
*G01F 1/28* (2006.01)
(Continued)

(52) U.S. Cl.
CPC .................. *G01L 1/12* (2013.01); *G01F 1/28* (2013.01); *G01L 1/044* (2013.01); *G01R 33/063* (2013.01); *B82Y 15/00* (2013.01); *G01R 33/09* (2013.01)

(58) Field of Classification Search
CPC ......... G01L 25/003; G01L 1/12; G01L 1/044; G01R 33/09; G01R 33/063; B82Y 15/00; H01F 7/08; G01F 1/28
(Continued)

(56) References Cited

U.S. PATENT DOCUMENTS 6,744,173 B2 * 6/2004 Behin .................. B81B 3/0021
310/309
7,189,435 B2 * 3/2007 Tuominen .............. B82Y 10/00
216/13
(Continued)

FOREIGN PATENT DOCUMENTS

CN    102 543 357 B     5/2013
CN    102543357    *    5/2013

OTHER PUBLICATIONS

Sniadecki et al., "Magnetic microposts for mechanical stimulation of biological cells: Fabrication, characterization, and analysis", 2008, pp. 2 and 7. (Year: 2008).*
(Continued)

*Primary Examiner* — Octavia Hollington
(74) *Attorney, Agent, or Firm* — Patent Portfolio Builders PLLC

(57) ABSTRACT

A magnetic nanocomposite device is described herein for a wide range of sensing applications. The device utilizes the permanent magnetic behavior of the nanowires to allow operation without the application of an additional magnetic field to magnetize the nanowires, which simplifies miniaturization and integration into microsystems. In addition, the nanocomposite benefits from the high elasticity and easy
(Continued)

patterning of the polymer-based material, leading to a corrosion-resistant, flexible material that can be used to realize extreme sensitivity. In combination with magnetic sensor elements patterned underneath the nanocomposite, the nanocomposite device realizes highly sensitive and power efficient flexible artificial cilia sensors for flow measurement or tactile sensing.

20 Claims, 17 Drawing Sheets

(51) Int. Cl.
   *G01R 33/06* (2006.01)
   *G01L 1/04* (2006.01)
   *B82Y 15/00* (2011.01)
   *G01R 33/09* (2006.01)

(58) Field of Classification Search
   USPC .................................. 73/862.625, 862.626
   See application file for complete search history.

(56) References Cited

U.S. PATENT DOCUMENTS

| | | | | |
|---|---|---|---|---|
| 7,891,102 B2* | 2/2011 | Peczalski | ............... | G01B 7/003 33/355 R |
| 7,927,666 B2* | 4/2011 | Ajayan | .................... | C08K 7/24 156/247 |
| 8,056,419 B2* | 11/2011 | Liu | ........................... | G01F 1/28 73/756 |
| 8,104,345 B2* | 1/2012 | Bruckl | .................... | B82Y 15/00 73/514.31 |
| 9,110,026 B2* | 8/2015 | Collins | .............. | G01N 21/6486 |
| 2007/0221917 A1 | 9/2007 | Chin et al. | | |
| 2010/0024231 A1 | 2/2010 | Peczalski | | |
| 2010/0124091 A1* | 5/2010 | Cowburn | ............... | B82Y 10/00 365/80 |
| 2010/0258443 A1 | 10/2010 | Fourkas et al. | | |
| 2011/0006286 A1* | 1/2011 | Wang | ..................... | H04R 17/02 257/24 |
| 2011/0080241 A1 | 4/2011 | Kou et al. | | |

OTHER PUBLICATIONS

EP Communication pursuant to Article 94(3) EPC in related European Application No. 15801245, dated Feb. 22, 2018.
Alfadhel A. et al.; "Magnetic Nanocomposite for Biomimetic Flow Sensing"; Lab on a Chip; 2014; 00, 1-6.
Alfadhel A. et al.; "Magnetic Polymer Nanocomposites for Sensing Applications"; IEEE 2014; pp. 1-4.
Chen et al.; "Design and Characterization of Artifical Haircell Sensor for Flow Sensing with Ultrahigh Velocity and Angular Sensitivity"; Journal of Microeletromechanical Systems; IEEE Service Center; vol. 16, No. 5; Oct. 1, 2007, pp. 999-1014; XP011193310.
Cubukcua et al.; "A 2D Thermal Flow Sensor with Sub-mW Power Consumption"; Sensors and Actuators A: Physical, (2010) 449-456.
Digabel et al.; "Magnetic Micropillars as a Tool to Govern Substrate Deformations"; Lab on a Chip, 2011, 11, 2630.
Hein et al.; "Fabrication of Bioinspired Inorganic Nanocilia Sensors"; IEEE Transactions on Magnetics; Jan. 1, 2013; vol. 49, No. 1; pp. 191-196; XP011483109.
International Preliminary Report on Patentability from International Application No. PCT/IB2015/058274, dated May 2, 2017, 17 pages.
International Search Report and Written Opinion from International Application No. PCT/IB2015/058274, dated Feb. 4, 2016, 24 pages.
Keshoju K. et al.; "Mechanical Characterization of Magnetic Nanowire-Polydimethylsiloxane Composites"; J. Appl. Phys.; 105, p. 023515-1-023515-5; 2009.
Khaderi et al., "Magnetically-Actuated Artificial Cilia for Microfluidic Propulsion"; Lab on a Chip, 2011, 11, p. 2002-2010.
Li B. et al.; "Integration of Thin Film Giant Magneto Impedance Sensor and Surface Acoustic Wave Transponder"; J. Appl. Phys.; 111; p. 07E514; 2012.
Li B. et al.; "Optimization of Autonomous Magnetic Field Sensor Consisting of Giant Magnetoimpedance Sensor and Surface Acoustic Wave Transducer"; IEEE Trans. Magnetics; vol. 48, No. 11, p. 4324-4327; Nov. 2012.
Li B. et al.; "Three Dimensional Simulation of Giant Magneto-Impedance Effect in Thin Film Based Sensors"; Journal of Applied Physics; 109, p. 07E519; 2011.
Liu, Chang; "Micromachined Biomimetric Artificial Haircell Sensors"; Bioinspiration & Biometrics; vol. 2, No. 4, Dec. 1, 2007; pp. S162-S169; XP020132826.
Panina L. et al.; "Magneto-Impedance in Multilayer Films"; Sensors Actuators A; 81; p. 71-77; 2000.
Suter M. et al.; "A Photopatternable Superparamagnetic Nanocomposite: Material Characterization and Fabrication of Microstructures"; Sens. and Actutat. B.; 156, p. 433; 2011.
Thongmee S. et al.; "Fabrication and Magnetic Properties of Metallic Nanowires via AAO Templates"; J. of Mag. and Mag. Mat.; 321, p. 2712-2716, 2009.
Examination Report in corresponding/related GC Application No. GC 2015-30280, dated Sep. 24, 2019 (Documents D1 and D2 were cited in the IDS filed Sep. 27, 2017).

\* cited by examiner

MAGNETIC NANOCOMPOSITE SENSOR

CROSS-REFERENCE TO RELATED APPLICATIONS

This application is a national stage entry of PCT patent application PCT/IB2015/058274, filed Oct. 27, 2015, which claims the benefit of U.S. Provisional Patent Application No. 62/073,160 filed Oct. 31, 2014. The entire contents of both of these applications are incorporated herein by reference.

TECHNOLOGICAL FIELD

Example embodiments of the present invention relate generally to force sensing and, more particularly, to a magnetic nanocomposite device providing high resolution force sensing with low power consumption.

BACKGROUND

Cilia are micro-scale, hair-like structures that exist in nature and extend from an organism's cells. Fish, for example, utilize cilia to assist in performing a variety of functions, such as preying or avoiding danger. In particular, when the cilia are exposed to a change in fluid flow, they bend and transmit a signal to the organism, providing the organism with sensory information enabling an appropriate reaction.

Recently, artificial cilia have been developed that could be used for various applications such as microfluidic propulsion, flow sensing, or the study of cell mechanics. For the flow sensing applications, different techniques have been utilized to detect cilia bending due to flow, such as by using thermal, piezoresistive, piezoelectric and magnetic bases.

For instance, a piezoresistive hair flow sensor, described in Chen et al. "Design and Characterization of Artificial Haircell Sensor for Flow Sensing With Ultrahigh Velocity and Angular Sensitivity," *J. Microelectromech. Syst.*, 2007: 999-1014, consists of a 600 µm by 80 µm vertical SU-8 hair-like structure fabricated by photolithography and a silicon resistor. This sensor was apparently able to detect constant air flow between 0 to 20 m/s with a sensitivity of 100 mm/s and water flow from 0 to 0.4 m/s with a sensitivity of 5 mm/s. The sensor was also apparently able to detect alternating flow velocity amplitudes down to the order of 0.7 mm/s in water at a frequency of 50 Hz.

Flow sensors based on a vertical cilium and a strain gauge were discussed by Chang Liu in "Micromachined biomimetic artificial haircell sensors," *Bioinspiration and Biomimetic,* 2007, 2 S162. This study included two prototypes: silicon-based and polymer-based cilia. The silicon-based sensor was mounted on a glass plate and placed in a water tunnel with laminar flow. For water flows with velocities from 0 to 1 m/s, a sensitivity of 0.5 mm/s was reported. The response of the polymer-based sensor increases exponentially within the tested range, when applying air flow with velocities ranging from 0 to 30 m/s. Chang concluded that silicon-based flow sensors showed higher sensitivity, whereas polymer-based sensors were more robust.

Hein et al. proposed an inorganic nanocilia sensor based on magnetic nanowires (NWs) in "Fabrication of BioInspired Inorganic Nanocilia Sensors," *IEEE Transactions on Magnetics,* 2013, 49, 191. The sensor utilizes the magnetic stray field of cobalt NWs for a biomimetic sensing approach. The NWs were mounted on a giant-magneto-resistive sensor to detect their motion. The sensor had two possible applications: flow sensing and vibration sensing. Water flows were detected from 3.3 m/s to 40 m/s with a sensitivity of 0.55 µV/m/s and a signal to noise ratio of 44, and vibrations in the low earthquake-like frequency range of 1 to 5 Hz. The stiffness of the bare magnetic NWs prevents the measurement of low flow velocities. Nanocilia made of metals like Cobalt have high possibility of corrosion, limiting their use for applications in, for example, microfluidic devices. Magnetic polymer cilia have also been realized using superparamagnetic nanoparticles embedded in thin polymer films for various applications. This approach requires the application of rather large magnetic fields. For instance, Khaderi et al. "Magnetically-actuated artificial cilia for microfluidic propulsion," *Lab on a Chip,* 2011, 11, 2002, applied a rotational magnetic field of 115 mT in amplitude and Digabel et al. "Magnetic micropillars as a tool to govern substrate deformations," *Lab on a Chip,* 2011, 11, 2630, used $23 \times 10^3$ T·m$^{-1}$ magnetic field gradient to actuate the cilia. A favorable property of magnetic cilia is the absence of an electric contact and the possibility of remote detection or actuation.

Recently, there has been a great interest in developing sensors with low power consumption. However, reducing power consumption usually leads to a reduction in the resolution. For example, a low power thermal flow sensor described in Cubukcua et al. "A 2D thermal flow sensor with sub-mW power consumption," *Sensors and Actuators A: Physical,* 2008, 2, 142, produced a resolution below 10 mm/s at 177 µW. However, high resolution thermal flow sensors have a power consumption of more than 1 mW. In this regard, hair flow sensors are attractive options and have been shown to operate at power consumption as low as 140 µW providing a resolution of 0.9 m/s.

BRIEF SUMMARY

Accordingly, embodiments disclosed herein illustrate magnetic nanocomposite sensors that can produce higher resolution results while consuming less power. As a non-limiting example, one sensor described herein may be composed of cylindrical polydimethylsiloxane (PDMS) pillars containing iron NWs and may be implemented on a giant magnetoimpedance (GMI) thin film sensor. In addition to improved resolution and power consumption properties, embodiments of the present invention, which may be embodied on a flexible substrate, can be fabricated simply and cheaply, provide high sensitivity and resistance to corrosion, and in some embodiments may operate wirelessly. Moreover, the high elasticity of the magnetic nanocomposite sensors described herein enables the detection of extremely small forces. These advantages, among others, make the magnetic nanocomposite sensors described herein suitable for many applications.

In a first example embodiment, a magnetic nanocomposite device is provided. The magnetic nanocomposite device includes a flexible substrate, a set of nanocomposite pillars having magnetic nanowires embedded therein, the magnetic nanowires creating a stray field, and a flexible magnetic sensor disposed on the flexible substrate, the flexible magnetic sensor configured to detect the stray field created by the magnetic nanowires. In some embodiments, the flexible substrate includes at least one of Kapton, polydimethylsiloxane (PDMS), or SU-8.

The flexible magnetic sensor may be magnetically anisotropic. In some embodiments, the magnetic nanocomposite device further includes one or more additional flexible magnetic sensors. In this regard, the one or more additional flexible magnetic sensors may be magnetically anisotropic. The flexible magnetic sensor may comprise a giant magnetoimpedance (GMI) sensor whose impedance is affected by the stray field. To this end, the GMI sensor may include a wireless transponder configured to transmit information regarding its impedance. Alternatively, the flexible magnetic sensor may comprise a giant magnetoresistance (GMR) sensor.

In some embodiments, the nanocomposite pillars include a PDMS or SU-8 polymer. In some embodiments, each nanocomposite pillar of the set of nanocomposite pillars is configured to deflect in an instance in which a force is applied thereto. To this end, deflection of a particular nanocomposite pillar of the set of nanocomposite pillars may cause a change in the stray field. A physical touch of an object, or a flow of gas or liquid, may cause the force applied to the nanocomposite pillars. In some embodiments, the nanocomposite pillars are disposed on the flexible magnetic sensor. Even if the nanocomposite pillars are not disposed on the flexible magnetic sensor, the flexible magnetic sensor is located within a proximity of the nanocomposite pillars that enables the flexible magnetic sensor to detect a stray field associated with nanowires embedded in each nanocomposite pillars of the set of nanocomposite pillars. In some embodiments, the nanowires comprise at least one of iron, cobalt, nickel, or iron gallium.

In some embodiments, the magnetic nanocomposite device further includes a computing system configured to receive an indication of a change in impedance measured by the magnetic sensor, and estimate a magnitude of a force applied to at least a subset of the set of nanocomposite pillars based on the change in impedance. Alternatively, the magnetic nanocomposite device may be configured to transmit an indication of the change in impedance measured by the magnetic sensor to a computing system. To this end, the magnetic nanocomposite device may be configured to transmit the indication of the change in impedance measured by the magnetic sensor to the computing system via wireless transmission. More specifically, the wireless transmission may have a central frequency of 433 MHz or 2.41 GHz.

In another example embodiment, a magnetic nanocomposite device is provided that includes a substrate, a set of nanocomposite pillars having magnetic nanowires embedded therein, the magnetic nanowires creating a stray field, and a magnetic sensor disposed on the substrate, the magnetic sensor configured to detect the stray field created by the magnetic nanowires.

The magnetic sensor may magnetically anisotropic. In some embodiments, the magnetic nanocomposite device further includes one or more additional magnetic sensors. In this regard, the one or more additional magnetic sensors may be magnetically anisotropic. The magnetic sensor may comprise a giant magnetoimpedance (GMI) sensor whose impedance is affected by the stray field. To this end, the GMI sensor may include a wireless transponder configured to transmit information regarding its impedance. Alternatively, the magnetic sensor may comprise a giant magnetoresistance (GMR) sensor. As yet another alternative, the magnetic sensor may be a magnetic tunnel junction sensor.

In some embodiments, the nanocomposite pillars include a PDMS or SU-8 polymer. In some embodiments, each nanocomposite pillar of the set of nanocomposite pillars is configured to deflect in an instance in which a force is applied thereto. To this end, deflection of a particular nanocomposite pillar of the set of nanocomposite pillars may cause a change in the stray field. A physical touch of an object, or a flow of gas or liquid, may cause the force applied to the nanocomposite pillars. In some embodiments, the nanocomposite pillars are disposed on the magnetic sensor. Even if the nanocomposite pillars are not disposed on the magnetic sensor, the magnetic sensor is located within a proximity of the nanocomposite pillars that enables the magnetic sensor to detect a stray field associated with nanowires embedded in each nanocomposite pillars of the set of nanocomposite pillars. In some embodiments, the nanowires comprise at least one of iron, cobalt, nickel, or iron gallium.

In some embodiments, the magnetic nanocomposite device further includes a computing system configured to receive an indication of a change in impedance measured by the magnetic sensor, and estimate a magnitude of a force applied to at least a subset of the set of nanocomposite pillars based on the change in impedance. Alternatively, the magnetic nanocomposite device may be configured to transmit an indication of the change in impedance measured by the magnetic sensor to a computing system. To this end, the magnetic nanocomposite device may be configured to transmit the indication of the change in impedance measured by the magnetic sensor to the computing system via wireless transmission. More specifically, the wireless transmission may have a central frequency of 433 MHz or 2.41 GHz.

In yet another example embodiment, a magnetic nanocomposite device is provided that includes a substrate, a nanocomposite member having magnetic nanowires embedded therein, the magnetic nanowires creating a stray field, and a magnetic sensor disposed on the substrate and configured to detect the stray field created by the magnetic nanowires.

The magnetic sensor may be magnetically anisotropic. In some embodiments, the magnetic nanocomposite device further includes one or more additional magnetic sensors. In this regard, the one or more additional magnetic sensors may be magnetically anisotropic. The magnetic sensor may comprise a giant magnetoimpedance (GMI) sensor whose impedance is affected by the stray field. To this end, the GMI sensor may include a wireless transponder configured to transmit information regarding its impedance. Alternatively, the magnetic sensor may comprise a giant magnetoresistance (GMR) sensor. As yet another alternative, the magnetic sensor may be a magnetic tunnel junction sensor.

In some embodiments, the nanocomposite member includes a PDMS or SU-8 polymer. In some embodiments, the nanocomposite member is configured to deflect in an instance in which a force is applied thereto. To this end, deflection of the nanocomposite member may cause a change in the stray field. A physical touch of an object, or a flow of gas or liquid, may cause the force applied to the nanocomposite member. In some embodiments, the nanocomposite member is disposed on the magnetic sensor. Even if the nanocomposite member is not disposed on the magnetic sensor, the magnetic sensor is located within a proximity of the nanocomposite member that enables the magnetic sensor to detect a stray field associated with nanowires embedded in each nanocomposite member. In some embodiments, the nanowires comprise at least one of iron, cobalt, nickel, or iron gallium.

In some embodiments, the magnetic nanocomposite device further includes a computing system configured to receive an indication of a change in impedance measured by the magnetic sensor, and estimate a magnitude of a force applied to the nanocomposite member based on the change in impedance. Alternatively, the magnetic nanocomposite device may be configured to transmit an indication of the change in impedance measured by the magnetic sensor to a computing system. To this end, the magnetic nanocomposite device may be configured to transmit the indication of the change in impedance measured by the magnetic sensor to the computing system via wireless transmission. More specifically, the wireless transmission may have a central frequency of 433 MHz or 2.41 GHz.

In yet another example embodiment, a method is provided. The method includes providing a magnetic nanocomposite device having a flexible substrate, a set of nanocomposite pillars having magnetic nanowires embedded therein that create a stray field, and a flexible magnetic sensor disposed on the flexible substrate and configured to detect the stray field created by the magnetic nanowires. The method further includes determining, in response to application of a force to a subset of the nanocomposite pillars, a change in impedance of the flexible magnetic sensor, and determining, based on the change in impedance of the flexible magnetic sensor, information regarding the application of the force, wherein the application of the force to the subset of the nanocomposite pillars causes the subset of the nanocomposite pillars to bend, wherein bending of the nanocomposite pillars causes a change in the stray field, and wherein the change in the stray field causes the change in the impedance of the flexible magnetic sensor.

In some embodiments, the information comprising the application of the force comprises an average flow velocity of a fluid causing the application of the force. In some embodiments, determining the information comprising the application of the force comprises determining that the magnetic nanocomposite device has been touched.

In yet another example embodiment, a method is provided. The method includes providing a magnetic nanocomposite device having a substrate, a set of nanocomposite pillars having magnetic nanowires embedded therein that create a stray field, and a magnetic sensor disposed on the substrate and configured to detect the stray field created by the magnetic nanowires. The method further includes determining, in response to application of a force to a subset of the nanocomposite pillars, a change in impedance of the magnetic sensor, and determining, based on the change in impedance of the magnetic sensor, information regarding the application of the force, wherein the application of the force to the subset of the nanocomposite pillars causes the subset of the nanocomposite pillars to bend, wherein bending of the nanocomposite pillars causes a change in the stray field, and wherein the change in the stray field causes the change in the impedance of the magnetic sensor.

The above summary is provided merely for purposes of summarizing some example embodiments to provide a basic understanding of some aspects of the invention. Accordingly, it will be appreciated that the above-described embodiments are merely examples and should not be construed to narrow the scope or spirit of the invention in any way. It will be appreciated that the scope of the invention encompasses many potential embodiments in addition to those here summarized, some of which will be further described below.

BRIEF DESCRIPTION OF THE DRAWINGS

Figure 1:
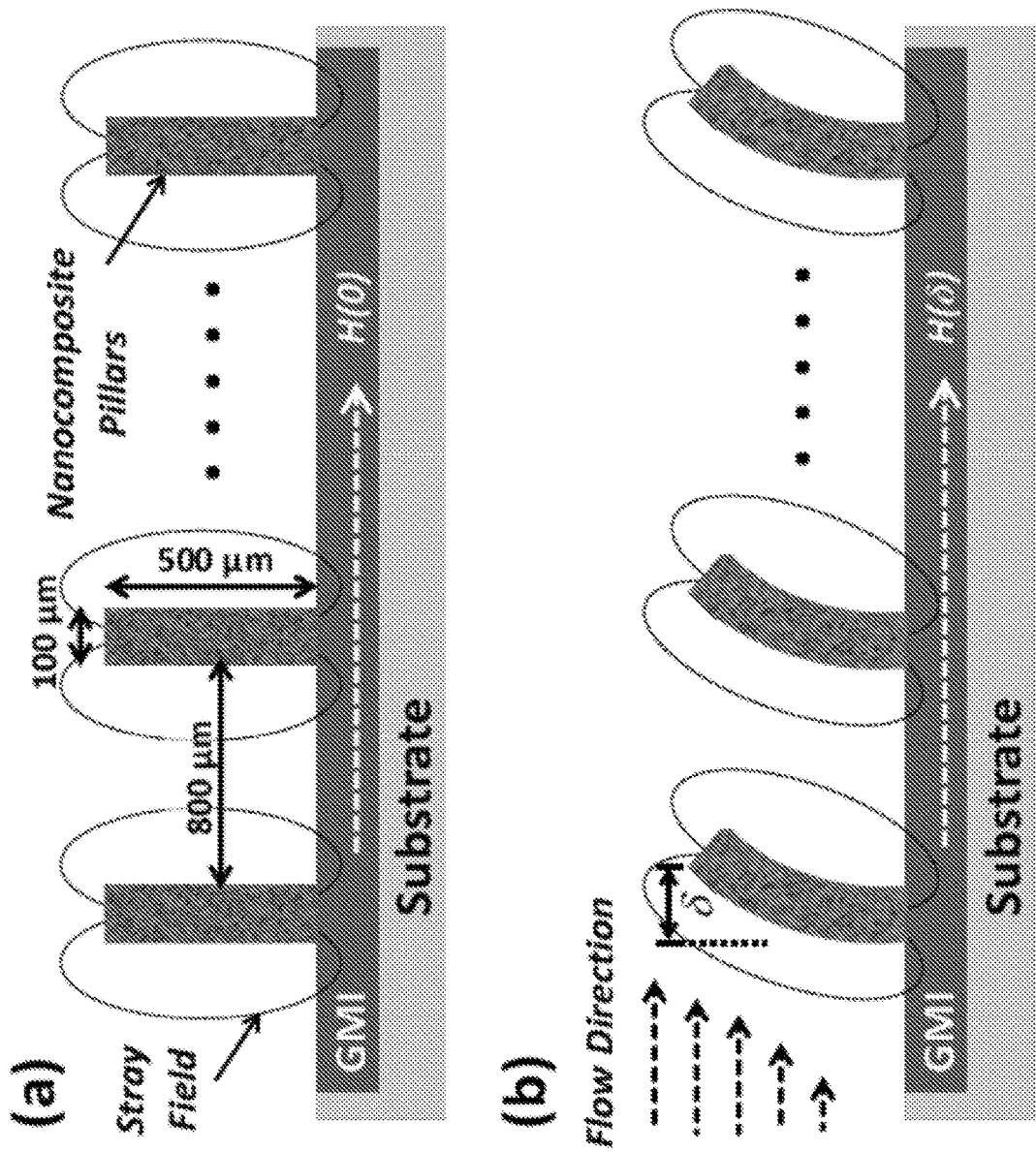
Figures 2, 3:
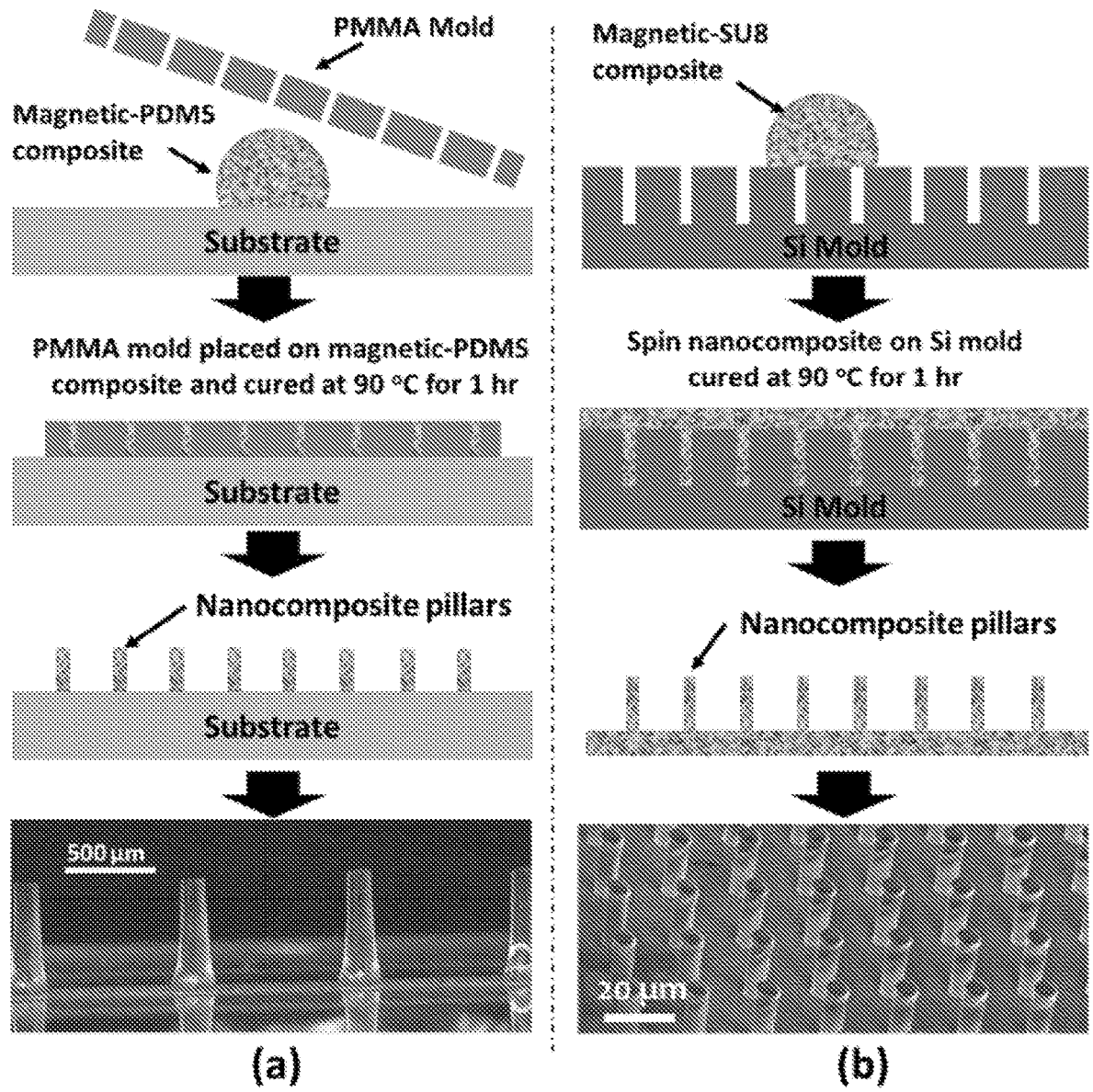
Figure 4A:
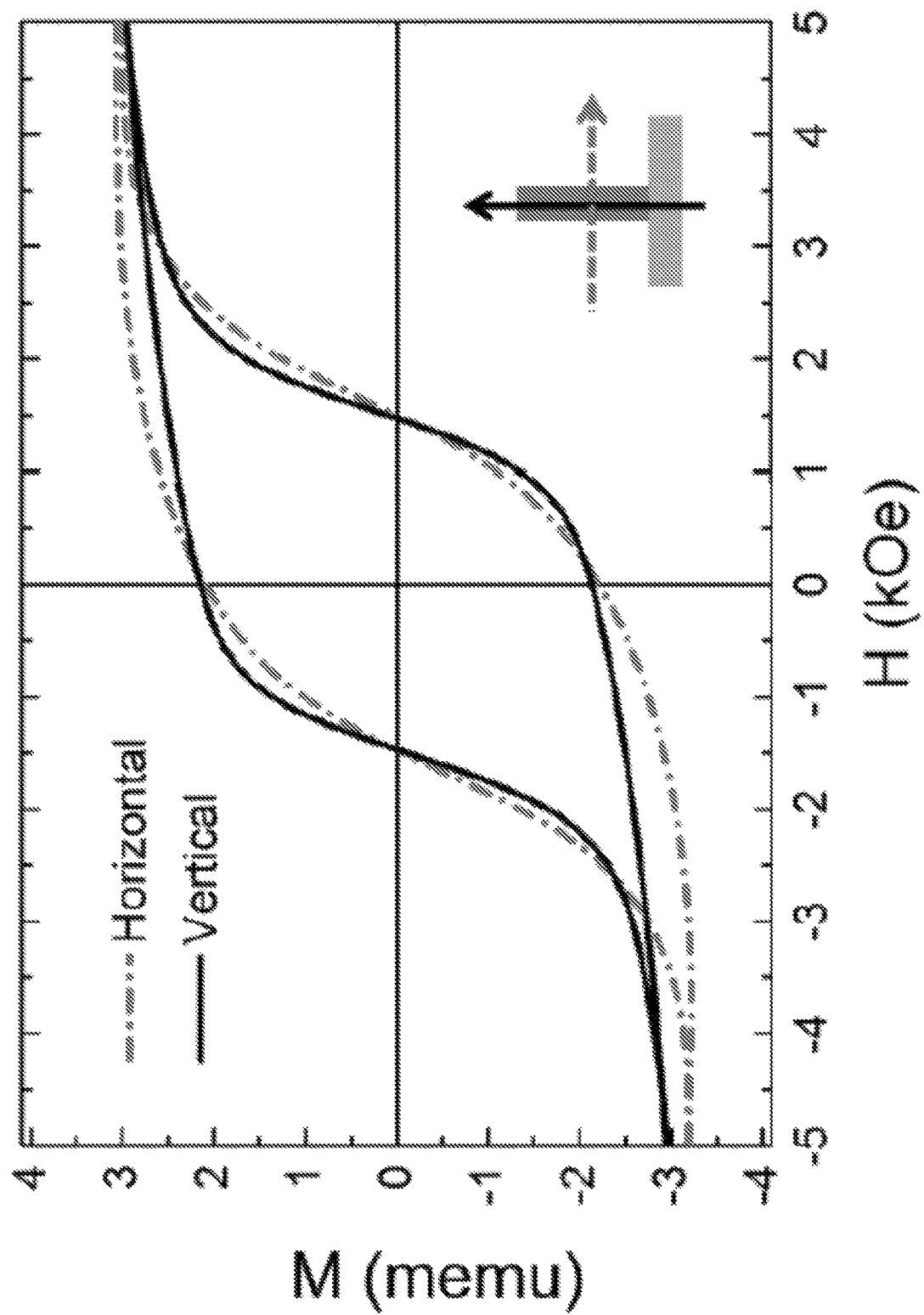
Figure 4B:
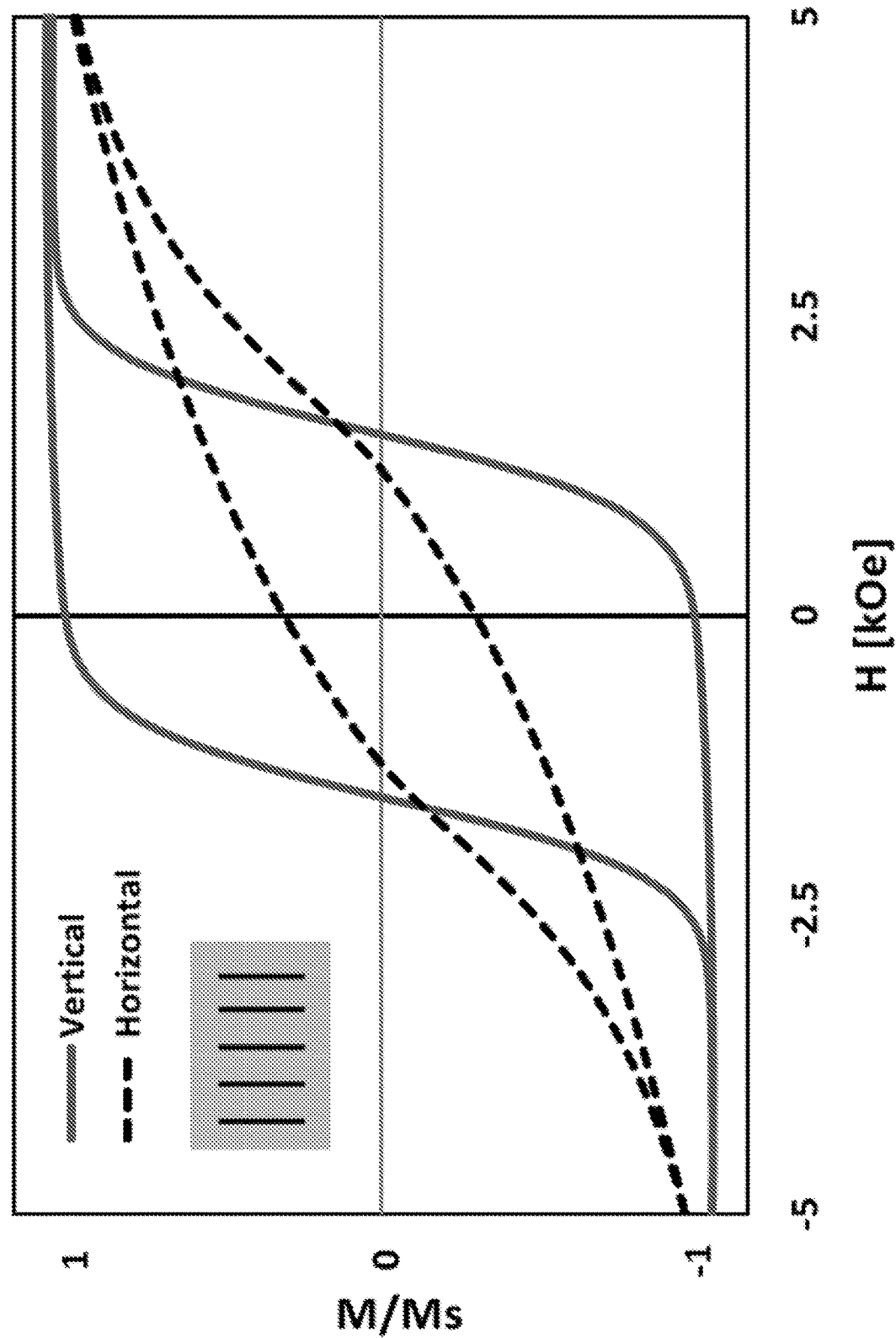
Figure 4C:
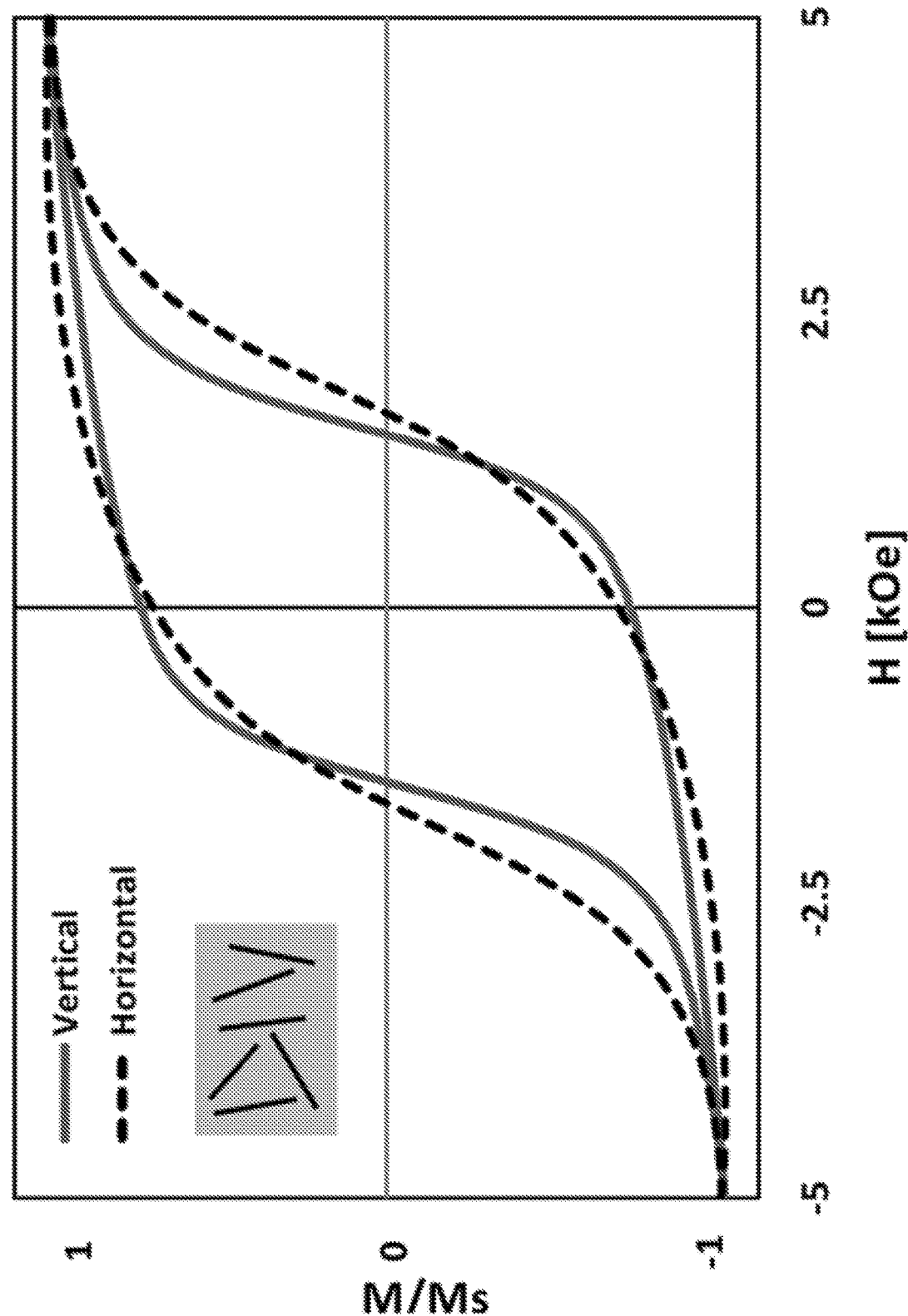
Figure 5:
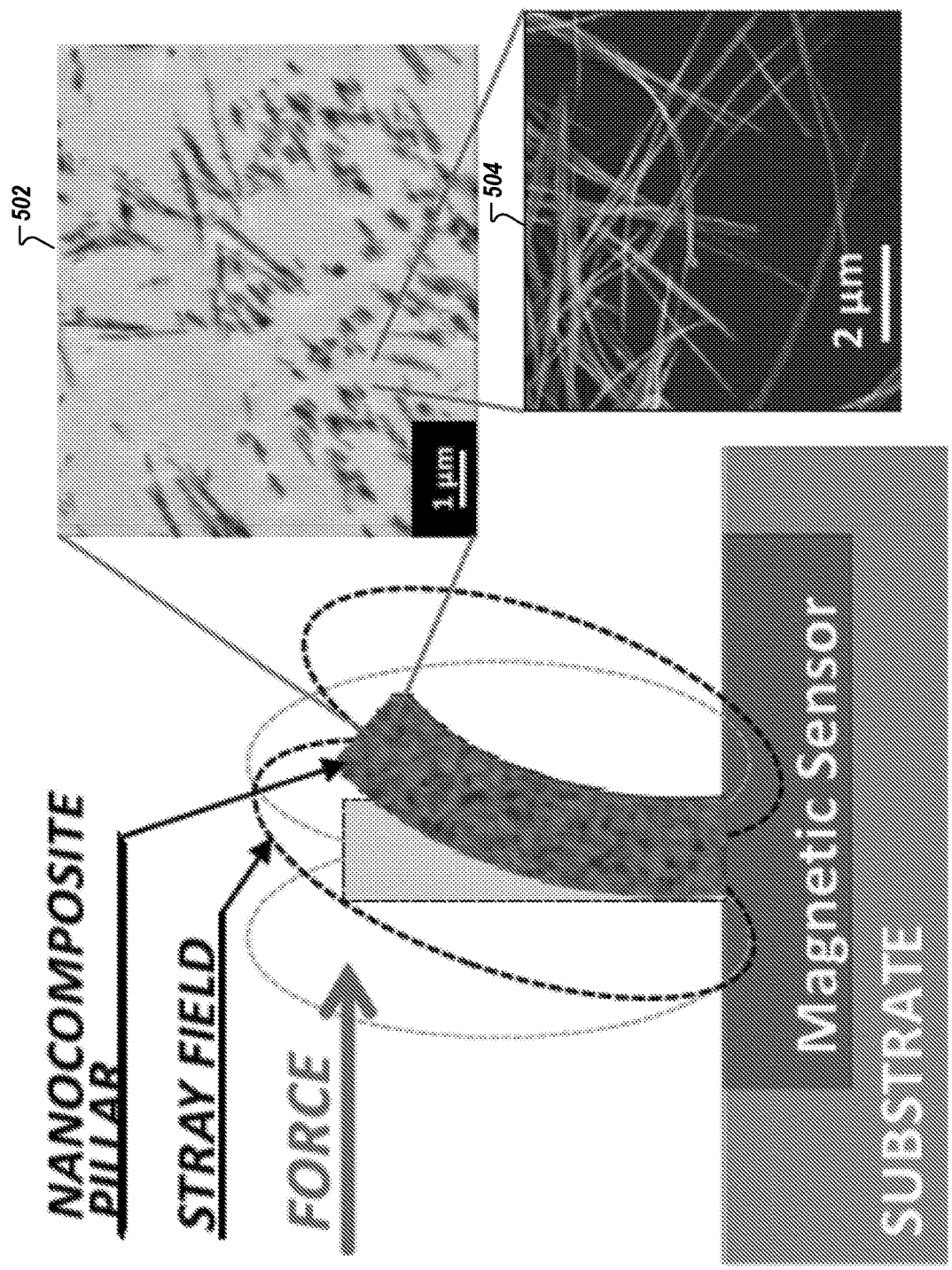
Figure 6:
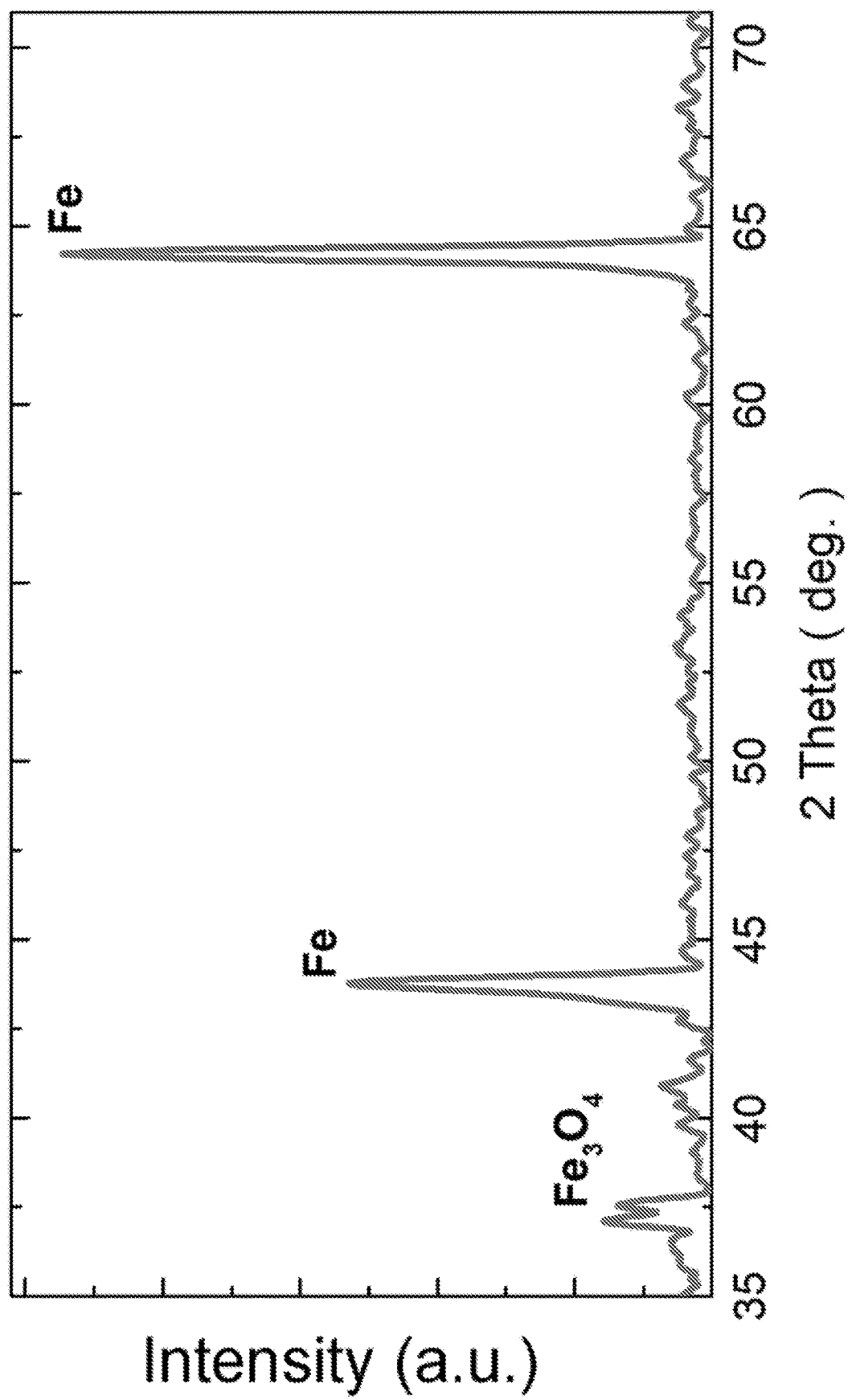
Figure 7:
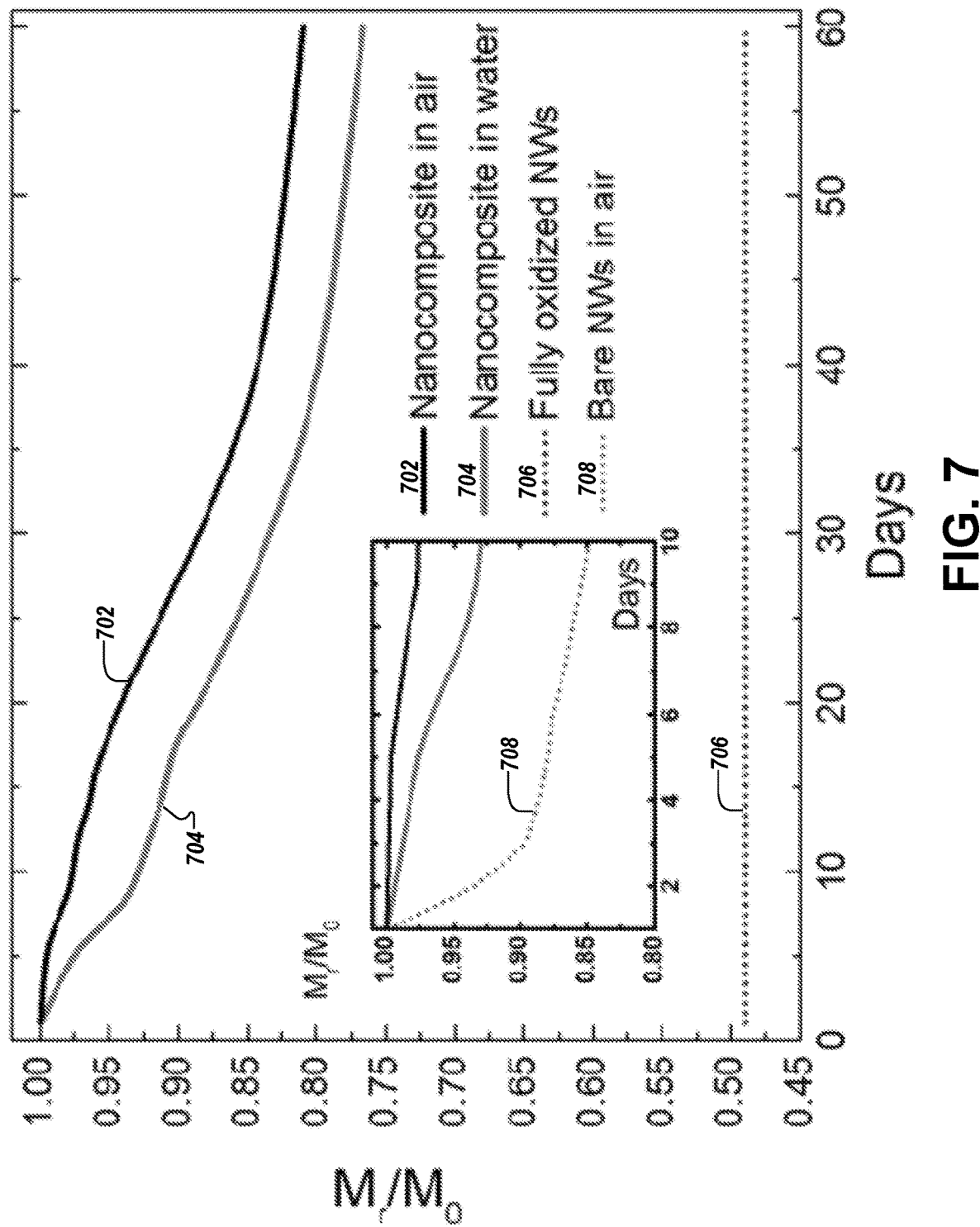
Figure 8A:
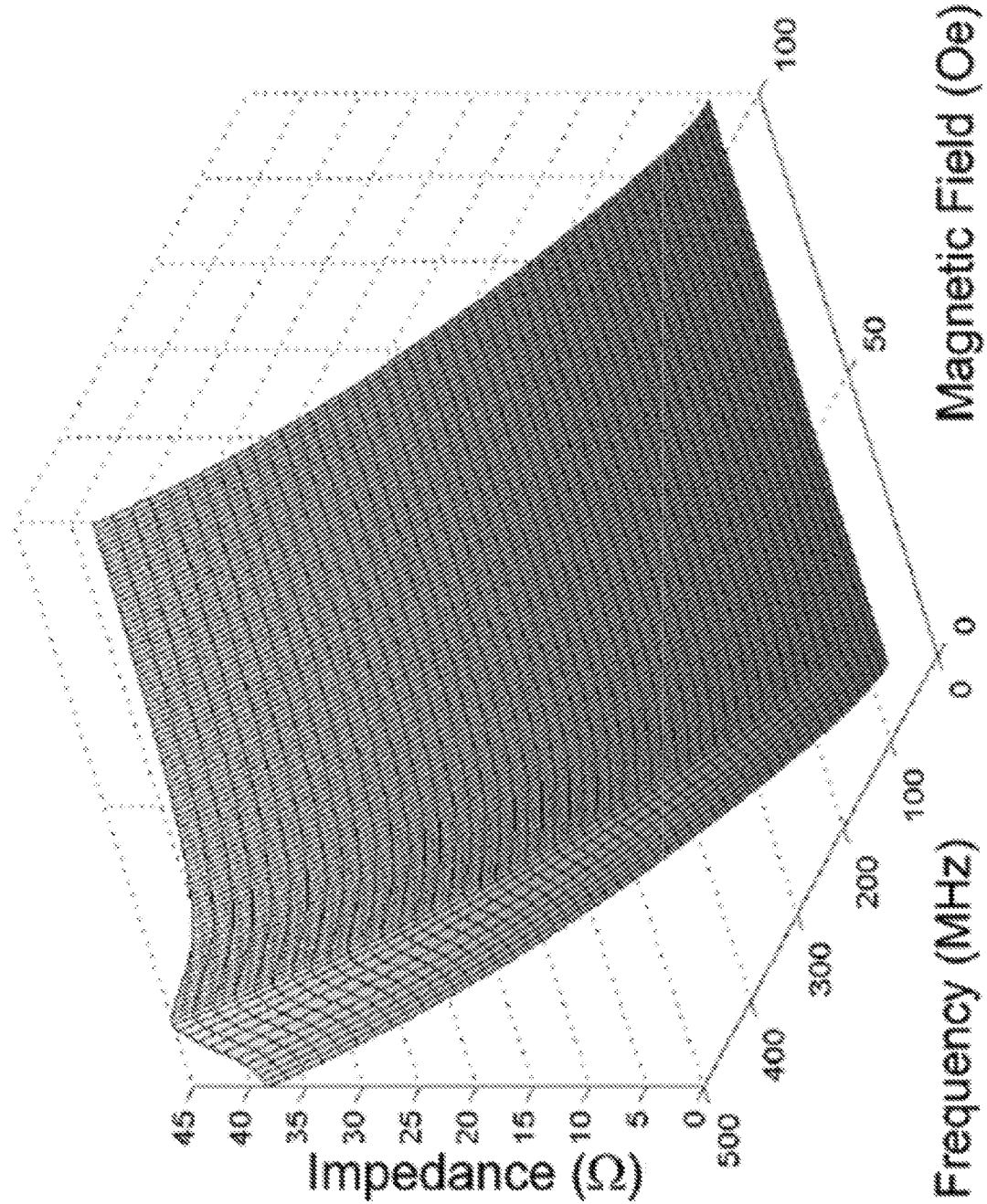
Figure 8B:
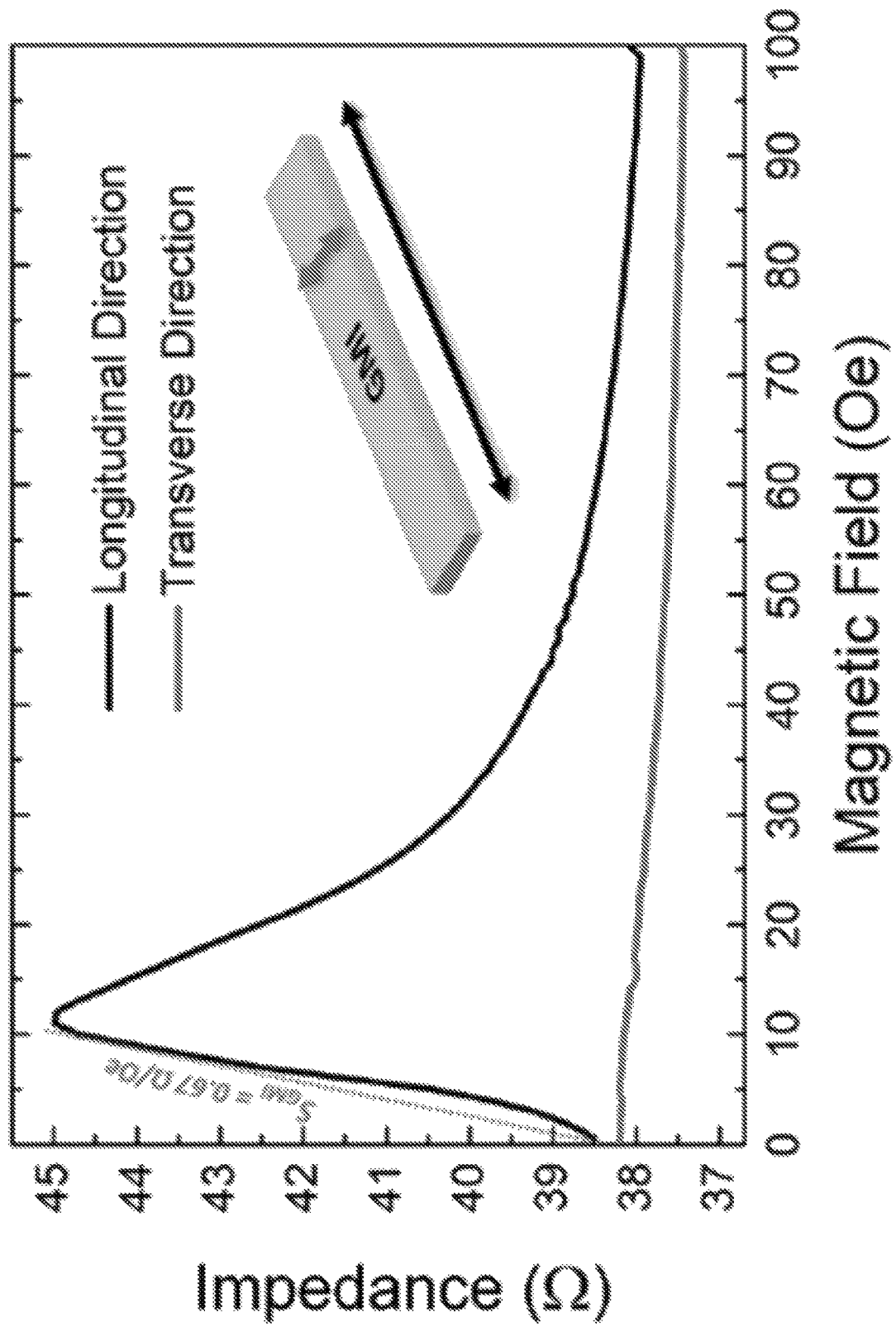
Figure 8C:
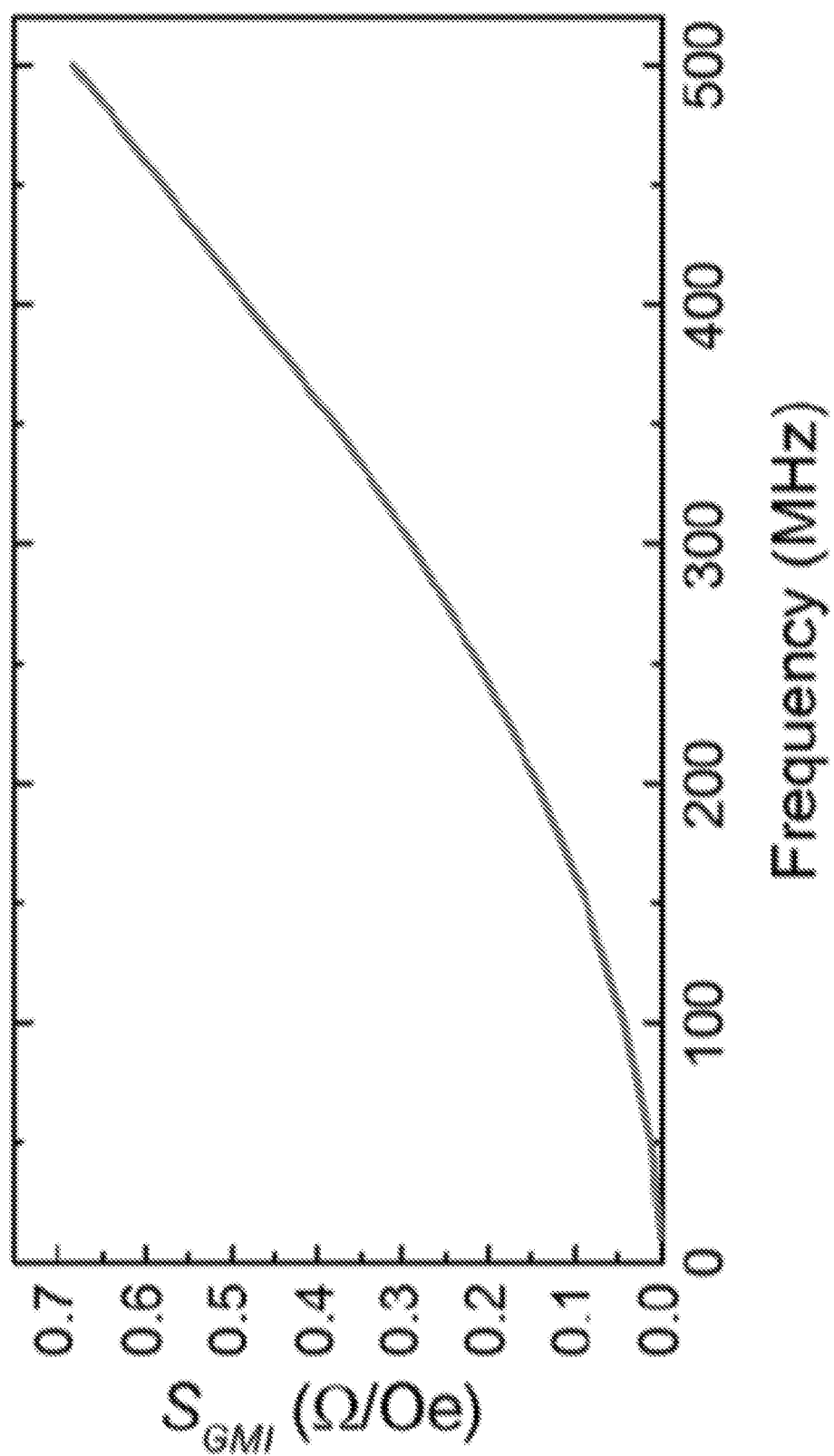
Figure 9:
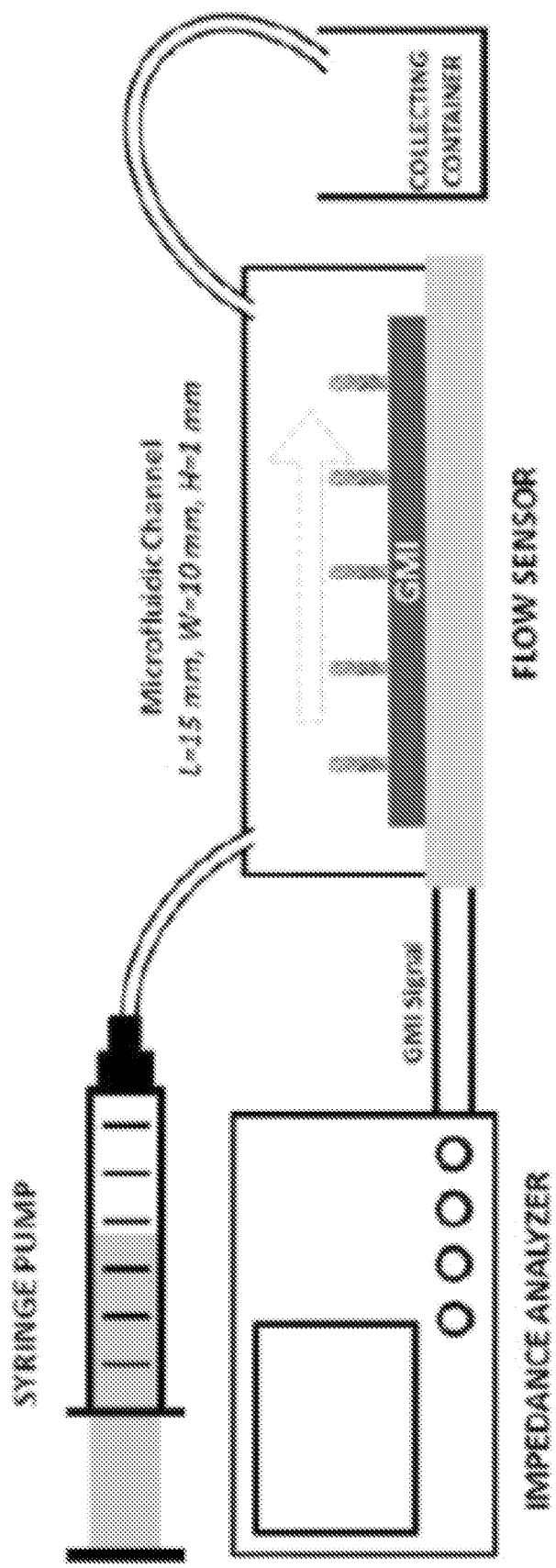
Figure 10A:
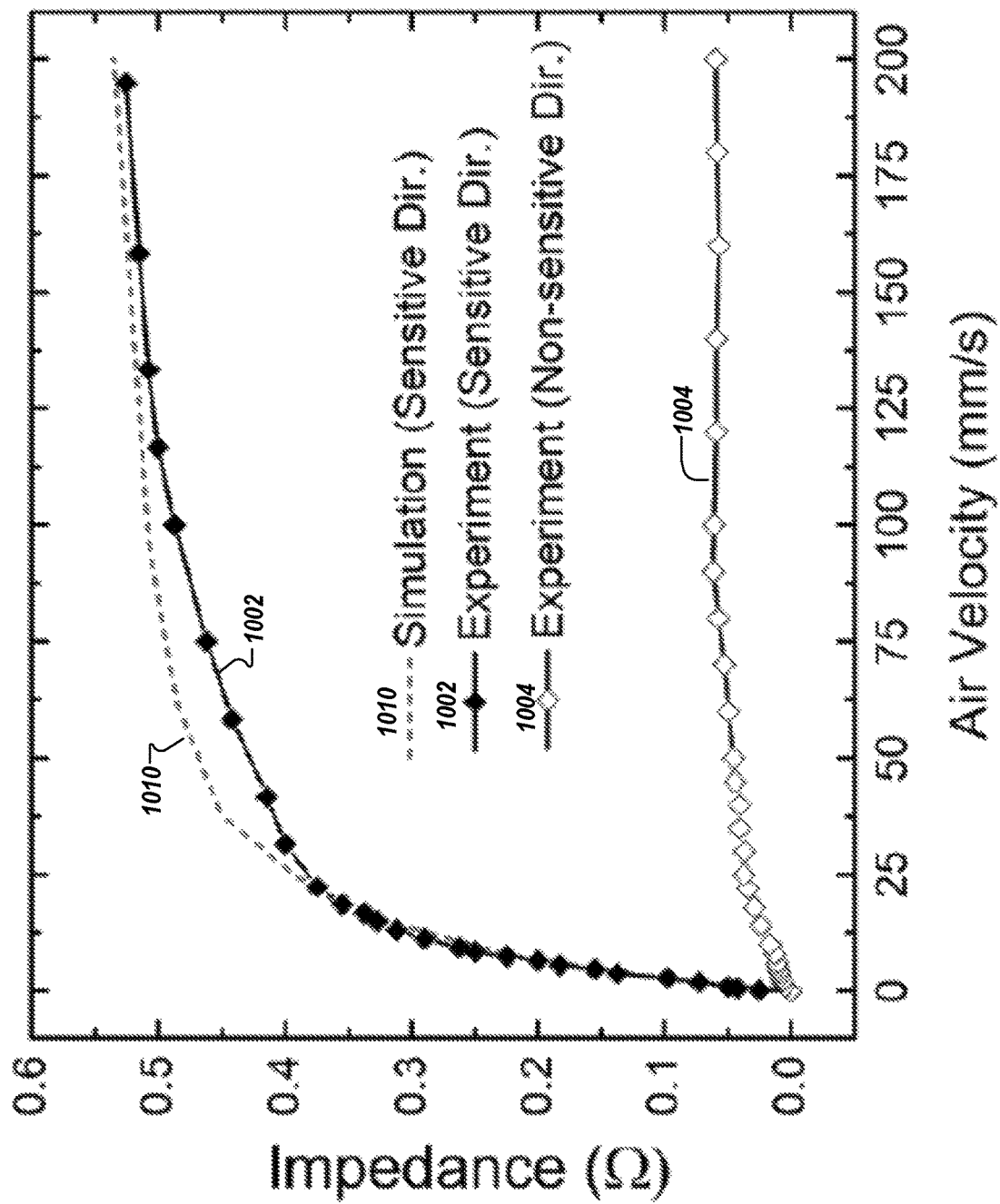
Figure 10B:
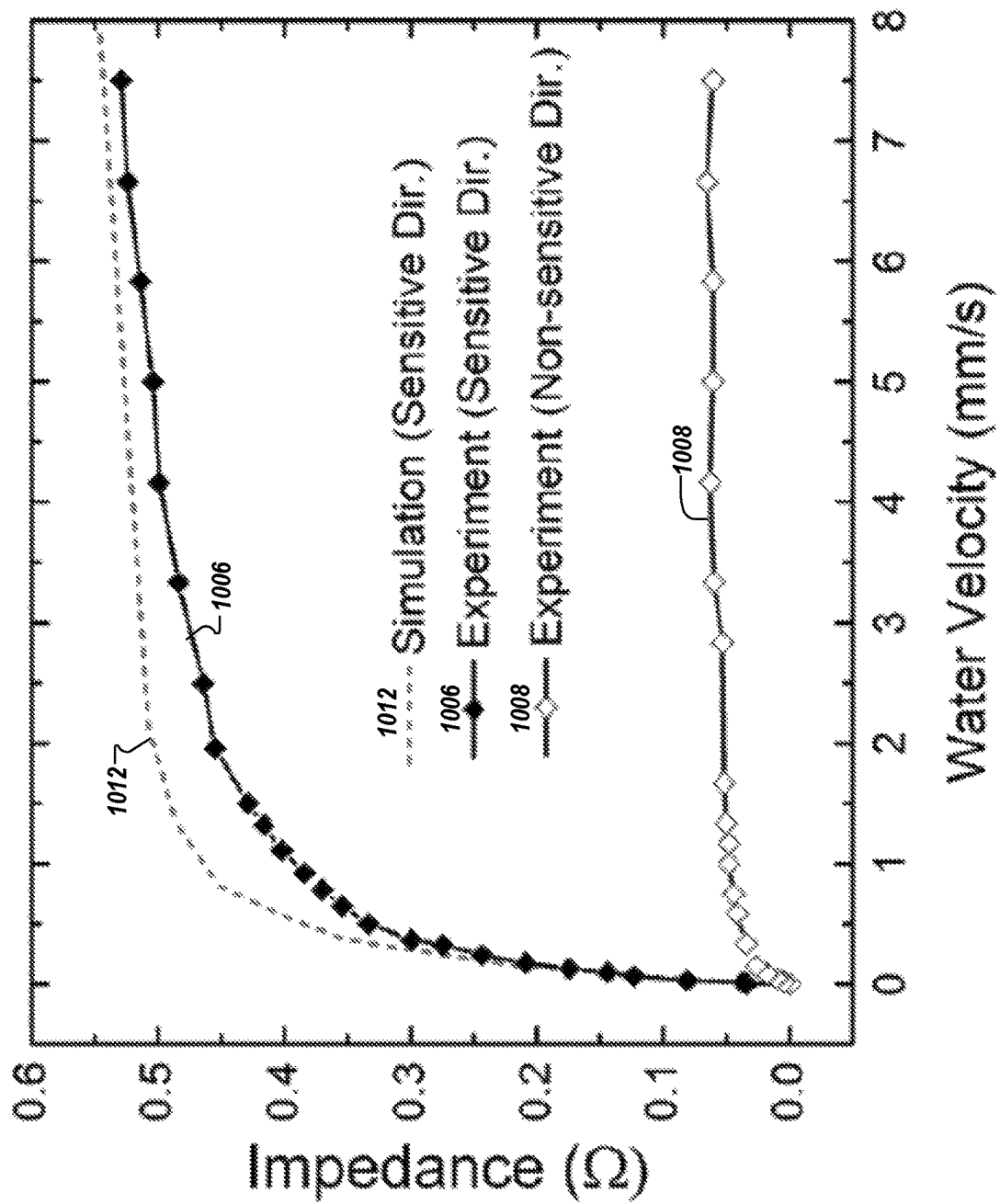
Figure 11:
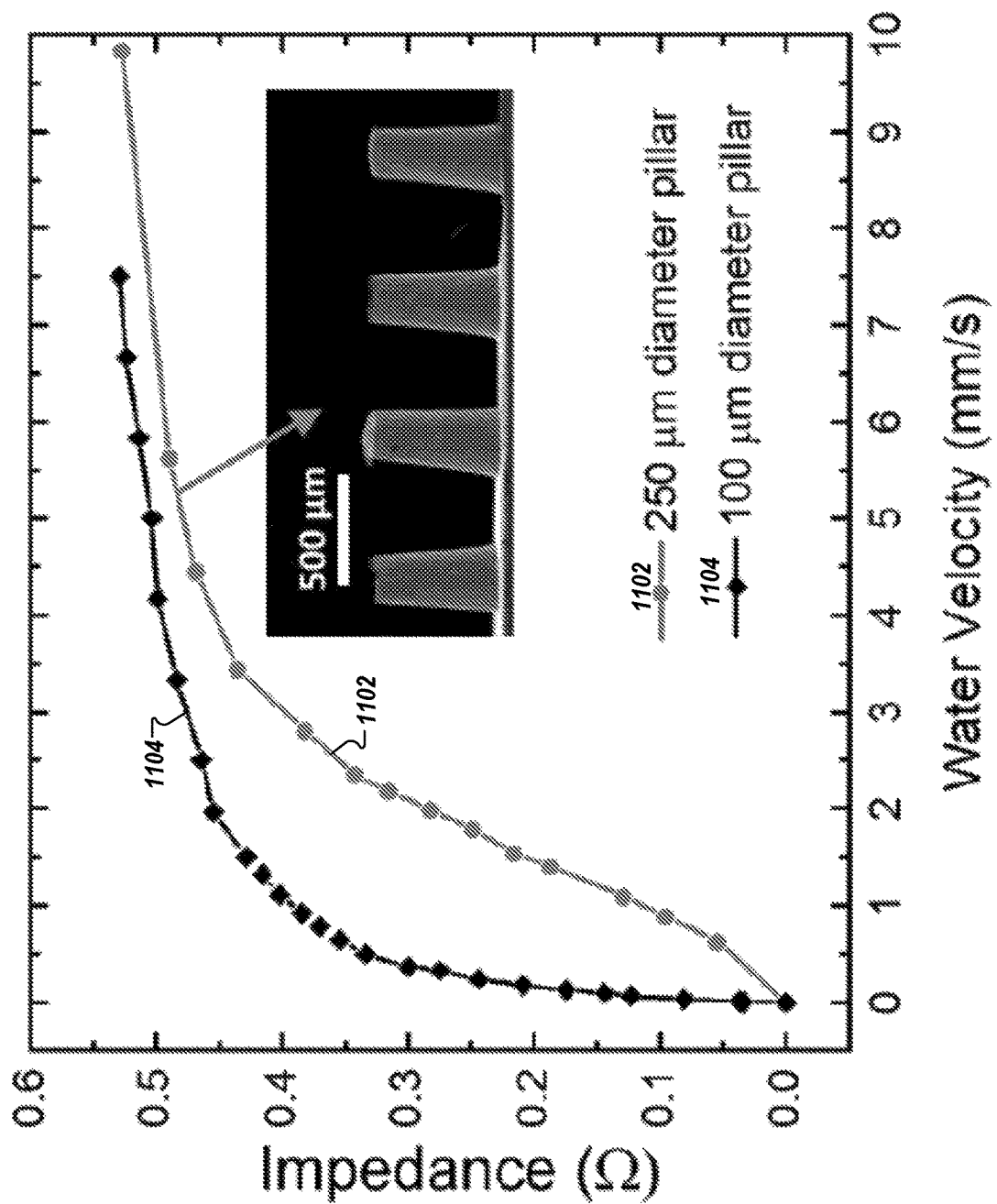
Figure 12:
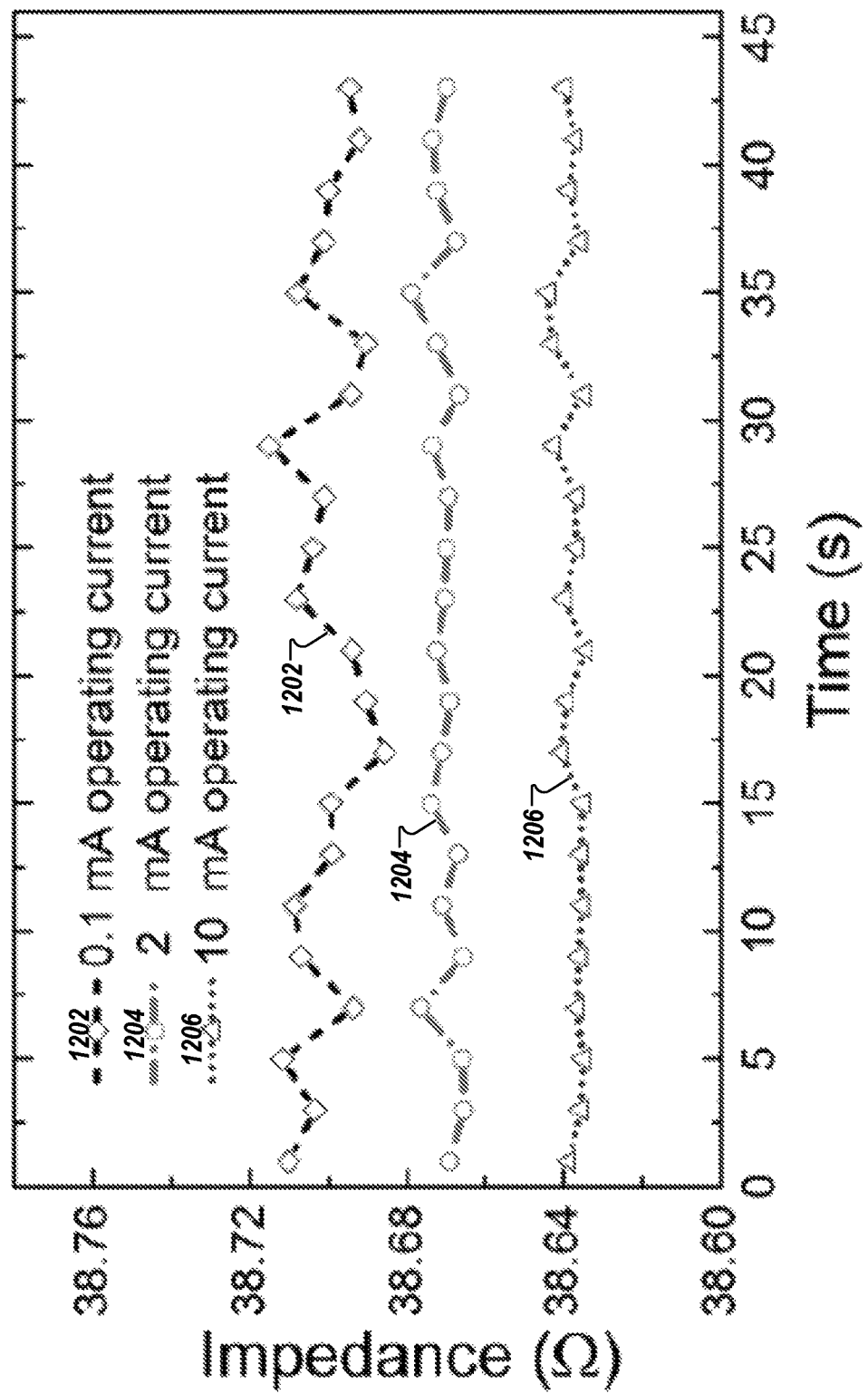
Figure 13:
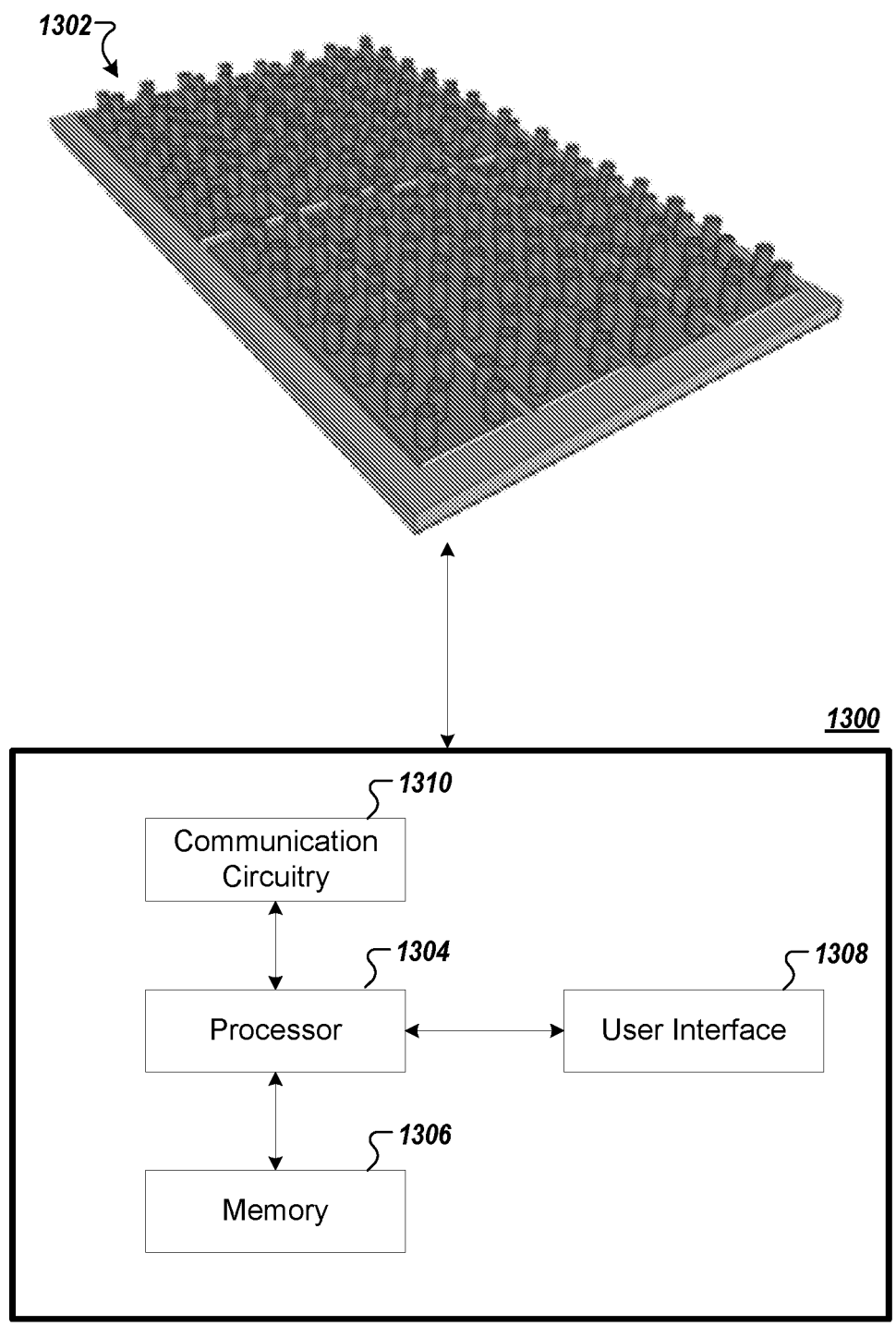

Having thus described certain example embodiments of the present disclosure in general terms, reference will now be made to the accompanying drawings, which are not necessarily drawn to scale, and wherein:

FIG. 1 illustrates an example magnetic nanocomposite flow sensor, in accordance with embodiments of the present invention;

FIG. 2 illustrates a sequence of steps for creating magnetic nanocomposite pillars with a PDMS base material, in accordance with example embodiments of the present invention;

FIG. 3 illustrates a sequence of steps for creating magnetic nanocomposite pillars using a SU-8 base material, in accordance with example embodiments of the present invention;

FIG. 4A illustrates magnetic properties of an example set of nanocomposite pillars, in accordance with example embodiments of the present invention;

FIG. 4B illustrates magnetic properties an example set of vertically aligned nanocomposite pillars, in accordance with example embodiments of the present invention;

FIG. 4C illustrates magnetic properties an example set of randomly aligned nanocomposite pillars, in accordance with example embodiments of the present invention;

FIG. 5 illustrates the distribution of nanowires inside nanocomposite pillars of an example embodiment of the present invention;

FIG. 6 illustrates x-ray diffraction analysis of a nanocomposite pillar, in accordance with example embodiments of the present invention;

FIG. 7 illustrates a comparison of remanent magnetizations, in accordance with example embodiments of the present invention;

FIG. 8A illustrates impedance characterization of an example GMI sensor as a function of the frequency and the magnetic field applied in the longitudinal direction, in accordance with example embodiments of the present invention;

FIG. 8B illustrates the impedance response of the example GMI sensor with external magnetic fields applied in the sensitive (longitudinal) and non-sensitive (transverse) directions at 500 MHz, in which the GMI sensor sensitivity $S_{GMI}$ was determined by a linear fit, in accordance with example embodiments of the present invention;

FIG. 8C illustrates sensitivity $S_{GMI}$ of the example GMI sensor along the sensitive direction as a function of frequency of an impedance analyzer, in accordance with example embodiments of the present invention;

FIG. 9 illustrates an experimental setup for testing a magnetic nanocomposite flow sensor by applying air and water volumetric flow rates, in accordance with example embodiments of the present invention;

FIGS. 10A and 10B illustrate experimental flow measurement results, in accordance with example embodiments of the present invention;

FIG. 11 illustrates the performance of example magnetic nanocomposite sensors, in accordance with example embodiments of the present invention;

FIG. 12 illustrates the current dependence of an example magnetic nanocomposite sensor, in accordance with example embodiments of the present invention; and FIG. 13 illustrates a system utilizing an example of the above-described magnetic nanocomposite sensors, in accordance with example embodiments of the present invention.

DETAILED DESCRIPTION

Some embodiments of the present invention will now be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The example device illustrated in FIG. 1 is composed of magnetic nanocomposite pillars (in this example, PDMS pillars into which iron NWs are incorporated) fabricated on top of a magnetic sensor, which in turn is disposed on a substrate. A GMI sensor is used in the example shown in FIG. 1, and this sensor may be of the type described by Li et al. in "Optimization of Autonomous Magnetic Field Sensor Consisting of Giant Magnetoimpedance Sensor and Surface Acoustic Wave Transducer," *IEEE Transactions on Magnetics,* 2012, 48, 11. However, it will be understood that alternative embodiments can utilize a giant magnetoresistance (GMR) sensor or any other magnetic sensor that provides the requisite sensitivity described herein (such as, for example, magnetic tunnel junction sensors). Historically, substrates used with sensing applications have been made of silicon, which is not, generally, flexible. However, the inventors have discovered the importance of flexibility of the underlying substrate in broadening the applicability of force sensing applications to a wider variety of situations. In such embodiments, the substrate on which the magnetic sensor and nanocomposite pillars are disposed may comprise a flexible material, such as Kapton, PDMS, SU-8, or the like. In these cases where flexibility of the sensor becomes essential, an inflexible magnetic sensor may break under the operating conditions expected with a flexible substrate. Accordingly, flexibility necessarily will limit the types of sensors that can be employed effectively (e.g., some GMI and GMR sensors may be flexible, but magnetic tunnel junction sensors are not).

The magnetic nanocomposite sensor operates by detecting changes in the magnetic field caused by deflection of the magnetic nanocomposite pillars. In the embodiment shown in FIG. 1, the GMI sensor, which offers a good compromise between sensitivity and fabrication complexity, is configured to measure these changes in the magnetic field. At small bias fields and at high operating frequencies, the impedance of GMI sensors is sensitive to external magnetic fields, due to the strong dependence of the skin effect on the magnetic permeability. A distinct advantage of embodiments disclosed herein is that the permanent magnetic behavior of the nanocomposite pillars remedies the need for an external magnetic field to magnetize the pillars or bias the GMI sensor. At resting position, the stray field of the pillars affects the GMI sensor with an average magnetic field value $H(0)$ that biases the sensor and changes its initial impedance. Upon application of a force (caused by the presence of a fluid flow or contact by an object), the pillars bend. This bending changes the stray field of the pillars that create an average magnetic field value $H(\delta)$ affecting the GMI sensor, and hence changes the impedance of the GMI sensor.

The magnitude of the force is obtained as the impedance change $\Delta Z$, which is the difference between the GMI sensor's impedance $Z_\delta$ when a force is applied and the pillars' tips are deflected by $\delta$, and the initial impedance $Z_0$ when no force is applied and $\delta=0$. The impedance can be calculated from the average magnetic field value at the GMI sensor and the sensitivity of the GMI sensor $S_{GMI}$, which is assumed to be constant about the operation point. In the context of a flow sensing application, the sensitivity S of the sensor is the impedance change over the average flow velocity $v_{avg}(\delta)$:

$$S = \frac{\Delta Z}{v_{avg}(\delta)} = \frac{Z_\delta - Z_0}{v_{avg}(\delta)} = \frac{S_{GMI}[H(\delta) - H(0)]}{v_{avg}(\delta)}. \tag{1}$$

Using S together with the maximum impedance fluctuation $Z_f$ (noise), the resolution of the sensor is:

$$R = \frac{Z_f}{S}. \tag{2}$$

The velocity inside the fluidic channel for a laminar flow is not constant but changes across the cross section area of the channel. The velocity is highest along the center of the channel and reduces toward the channel walls. The average flow velocity $v_{avg}$ is estimated to be one half of the maximum flow velocity.

Using the displacement-force relationship of an elastic cylindrical beam, the value of $\delta$ can be expressed for uniformly distributed forces F along the length of the pillar as:

$$\delta = \frac{64}{3} F \frac{l^3}{\pi E D^4}, \tag{3}$$

where l, E, and D represent the length, the Young's modulus and the diameter of the pillars, respectively. Hence, the detection range and sensitivity can be easily controlled by modifying the mechanical properties of the nanocomposite pillars (e.g., adjusting their lengths, Young's modulus, and/or diameter).

In the case of a flow sensor, equation (3) can be further manipulated to produce the following equation (3.1):

$$\delta = \frac{64}{3} F \frac{l^3}{\pi E D^4} = \frac{64}{3} \left( \frac{1}{2} \rho v_{avg}(\delta)^2 C_D A(\delta) \right) \frac{l^3}{\pi E D^4}. \tag{3.1}$$

In equation (3.1), the force is proportional to the fluid density $\rho$, drag coefficient $C_D$ and the area of the pillars that is facing the flow $A(\delta)$, which is a function of $\delta$, since the effective area is reducing as the pillars bend. $C_D$ is computed by:

$$C_D = 0.8 + \frac{13.6}{Re} = 0.8 + \left( \frac{13.6 \mu}{\rho v_{avg}(\delta) D_h} \right), \tag{4}$$

where Re is the Reynolds number, $D_h$ is the hydraulic diameter and $\mu$ is the fluid dynamic viscosity. In some embodiments, PDMS (and/or SU-8) may be specifically chosen as a base polymer for the nanocomposite pillars both for advantages like chemical resistance, but also for the low Young's modulus value it provides, making the pillars highly elastic and easy to bend at small flow velocities.

Fabrication

The magnetic sensor (which, in one embodiment, may be 8 mm long and 400 μm wide) can be multi-layer, and in one embodiment may be composed of a Copper (Cu) layer (which may be 200 nm thick) sandwiched by two $Ni_{80}Fe_{20}$ layers (which in one embodiment may each be 100 nm thick). The materials are deposited onto a glass substrate, in one embodiment by e-beam evaporation, with a constant magnetic field of 100 Oe applied in the transverse direction to induce a uniaxial magnetic anisotropy, creating a magnetically sensitive axis in the longitudinal direction. The sensor can be patterned by a lift-off process, as shown in FIGS. 2 and 3 below. In some embodiments, more than one magnetic sensor may be used. In this regard, multiple sensors may be placed on top of each other and designed for magnetic sensing in complementary fashion (e.g., a first magnetic sensor may be able to detect longitudinal changes to a magnetic field, while another magnetic sensor layered thereon may be able to detect transverse changes to the magnetic field).

In this regard, iron NWs can be fabricated by electrodeposition in nanoporous aluminum oxide, prepared by a two-step anodization process using oxalic acid on an aluminum substrate. In one embodiment, iron is chosen for its high magnetization at remanence and high coercivity, creating a large stray field and making the pillars hard to demagnetize. Moreover, iron NWs are biocompatible (which may be particularly important in prosthetic application) and can be efficiently fabricated with this process with a high control of the properties. However, other materials may alternatively be used, such as Cobalt (Co), Nickel (Ni), or iron-gallium (FeGa). For instance, iron may be chosen for its powerful magnetic properties, but other materials may be chosen for the unique properties they possess. For instance, each of the above materials possesses different magnetostrictive properties that can enable elongation or shortening of the NWs within the nanocomposite pillars based on the strength of the magnetic field. FeGa, for example, provides a higher level of magnetostriction, and thus may be a useful choice in situations where length change of the nanowires is more important than the above-described favorable properties of iron NWs.

The nanocomposite pillars can be fabricated using a master mold technique. For instance, they may be fabricated using a poly(methyl methcrylate) (PMMA) master mold (which, in an example embodiment used herein, may be 500 µm thick) into which an array of holes (e.g., 8 holes), separated a predetermined distance apart (e.g., 800 µm) and each having a similar diameter (e.g., 100 µm), can be patterned with a CO2 laser cutter (e.g., using a Universal PLS 6.75). The nanocomposite can be prepared by mixing iron NWs dispersed in Sodium dodecyl sulfate (SDS) surfactant in PDMS (e.g., Sylgard 184 Silicone Elastomer, Dow Corning Corporation) to produce a polymeric matrix (which in one embodiment may contain an 18% NWs to PDMS volume ratio, which is sufficient to provide the biasing field for the magnetic sensor, but does not adversely affect the polymerization process of the PDMS or the elasticity of the pillars).

FIG. 2 illustrates a sequence of steps for creating the magnetic nanocomposite pillars with a PDMS base material. The composite is cast onto the surface of the substrate and a master mold is then mounted on top of the composite such that the pillars are aligned with the substrate, as shown in FIG. 2 (in one embodiment, the pillars are also aligned above the magnetic sensor, which is not shown in FIG. 2). This structure can be placed in a desiccator (e.g., for 30 minutes) to remove any trapped air bubbles and assist in filling the pores. Next, the composite can be cured (e.g., at 90 degrees Celsius for 1 hour) to form the pillars. After releasing the cured pillars by dissolving the PMMA mold with, for example, a chloroform solution, the cured pillars can be fully magnetized by applying a magnetic field of 10 kOe.

Alternatively, UV sensitive SU-8 may be used as the base polymer material instead of PDMS. FIG. 3 illustrates a sequence of steps for creating the magnetic nanocomposite pillars using a SU-8 base material. The photopatternable nanocomposite is prepared by mixing the NWs dispersed in an SU-8 thinner with SU-8 (e.g., GM1050) negative resist (e.g., MicroChem). To avoid settling of the NWs and attain a uniform dispersion, samples can be mixed by vortexing (e.g., at 3000 rpm for 10 min) immediately prior to use. The nanocomposite is applied to a silicon mold, prepared by standard lithography and deep reactive ion etching, and spun at 500 rpm for 5 s (ramp rate of 100 rpm/s) followed by 30 sat 1800 rpm (ramp rate of 500 rpm/s). This is followed by pre-exposure baking, UV exposure, post exposure baking, and development steps conducted according to the manufacturer's recommendations for SU-8. The pillars can then be peeled off the silicon mold as shown in FIG. 3. A particular benefit of the lithography process is that the nanocomposite pillars can be developed with greater resolution than is possible using a casting process.

The same methods can be utilized to develop a tactile sensor element made of an array of nanocomposite pillars (e.g., 500 µm long and 100 µm in diameter nanocomposite pillars with 18% iron NWs to PDMS volume ratio), integrated on a GMI magnetic field sensor (e.g., a 4 mm long and 400 µm wide GMI magnetic field sensor). The permanent magnetic behavior of the NWs in the nanocomposite enables both detecting the deflection of the pillars due to a force with the GMI sensor and, biasing the GMI sensor at its optimal operation point. This greatly simplifies miniaturization and integration of the tactile sensor and minimizes power consumption.

FIGS. 2 and 3 illustrate an example of the PDMS-based nanocomposite pillars and the SU-8-based nanocomposite pillars, respectively. It will be noted that the bottom diameter of the PDMS pillars is slightly wider than the top diameter in this illustration, which is a result of patterning the mold with the laser beam. However, it should be appreciated that in both embodiments, the properties of the nanocomposite pillars can be tailored in a wide range by the choice of the polymer or magnetic material as well as by the dimensions and concentration of the NWs.

To this end, the nanocomposite pillars may take a number of different shapes based on desired sensing properties. For instance, in some embodiments, it may be important to vary the diameters of various nanocomposite pillars, to ensure that some nanocomposite pillars have greater sensitivity than others (if the mixture of sensitivities is known, then the forces sensed can further indicate a pressure of a tactile force being applied to the magnetic nanocomposite sensor based on the nature of the change in impedance of the magnetic sensor). Similarly, varying the height of the nanocomposite pillars can also affect sensitivity, but may have an adverse impact on durability. Accordingly, a mix of multiple heights and diameters of nanocomposite pillars can be designed to maximize the force sensing capabilities of the magnetic nanocomposite sensor. Another factor that may be considered when determining an appropriate geometry of the nanocomposite pillars is the direction of deflection. For instance, when deflection in the longitudinal direction is important, the nanocomposite pillars can be shaped in a manner that minimizes deflection in the transverse direction (e.g., a wide rectangle). However, when deflection in both directions is important geometries that do not restrict deflection in any particular direction may be used (e.g., a circle). Moreover, the concentration of the NWs is another factor that can be manipulated to achieve a desired property (e.g., resolution, cost, durability, or the like). It should be appreciated that a wide variety of geometries and concentration of nanocomposite pillar is contemplated for use in embodiments of the present invention.

Furthermore, the alignment of the NWs within each nanocomposite pillar is another degree of freedom with which to adjust these properties. This can be seen from the magnetization curves of nanocomposites with vertically aligned NWs and randomly aligned NWs, shown in FIGS. 4B and 4C, which have anisotropic properties in case of aligned NWs and isotropic ones in case of randomly oriented NWs, respectively.

Characterization

Since high elasticity of the nanocomposite pillars provides high sensitivity to applied forces, the influence of the NWs on the Young's modulus is an important consideration. This influence can be tested by applying a constant force to a pillar incorporating the NWs and applying a similar force to a pillar that does not incorporate NWs. In one such example, a force of 0.5 N applied to a 2 cm long, 1 cm wide and 500 µm thick PDMS sample comprising 18% NWs demonstrated a Young's modulus of 270 kPa, which is only a slightly higher value than the 255 kPa found for a corresponding pure PDMS sample subjected to the same force. Hence, the advantage of the high elasticity of the polymer base of the pillar can be largely maintained even when NWs have been incorporated into the pillar.

A vibrating sample magnetometer can be used to test the magnetic properties of the nanocomposite pillars by obtaining the magnetization curves along the length of the nanocomposite pillars and along the perpendicular direction. FIG. 4A demonstrates that the example nanocomposite pillars described in the paragraph above have a remanence magnetization of 2.1 memu, and a remanence to saturation magnetization ratio of 0.7 with a coercivity of 1520 Oe. The similarity of the magnetization curves in the vertical and horizontal directions indicates that the NWs in this example are not fully aligned in a specific direction in the composite, with the vertical direction being slightly preferred. As shown in FIG. 4B, nanocomposite pillars with vertically aligned NWs using a homogeneous magnetic field of 100 mT produces a remanence to saturation magnetization of 95% along the vertical direction and 37% along the horizontal direction. On the other hand, nanocomposite pillars with randomly aligned NWs have a remanence to saturation magnetization ratio of about 70% in both vertical and horizontal directions, as shown in FIG. 4C.

Electron microscopy images show the distribution of the NWs inside the nanocomposite pillars (illustrated in item 502 in FIG. 5) and can be used to determine the length of the NWs (a larger magnification of which are illustrated in item 504 in FIG. 5). X-ray diffraction analysis (results of which are illustrated in FIG. 6) reveals that the NWs are polycrystalline iron with a thin shell of magnetite around the NWs.

Iron NWs can be easily oxidized when exposed to a humid environment, which reduces the magnetization of the NWs. In order to study the potential impact of this fact on operation of embodiments of the present invention, the remanent magnetizations of an example nanocomposite exposed to air and a corresponding nanocomposite kept in water were measured over a period of 60 days. These measurements are illustrated by curves 702 and 704 in FIG. 7. As illustrated, the magnetization of the iron NWs drops over time, but with a reducing rate. The sample exposed to air kept 81% of the initial magnetization while the sample kept in water kept 76% of the initial magnetization. NWs inside the composite oxidize due to the fact that PDMS is permeable to water molecules. This fact explains the higher magnetization reduction rate for the sample kept in water. FIG. 7 also shows the remanent magnetizations of iron NWs that were fully oxidized by placing them in an oven for 24 hours at 150° C. (curve 706 in FIG. 7).

Oxidation of the NWs occurs by the formation of magnetite as found by transmission electron microscopy. The magnetization of such magnetite NWs is found to be 49% of that of iron NWs. This value is higher than the 30% reported in literature, which we attribute to an oxide layer around the NWs at the beginning of the experiment. A comparison of the oxidization rate of the example nanocomposites to bare iron NWs (curve 708 in FIG. 7) shows that the latter oxidize at a much higher rate. After 10 days, the remanent magnetization of the bare iron NWs in air drops to 85% of the initial magnetization compared to the 98% and 92.5% of nanocomposite exposed to air and water, respectively. In any event, even fully-oxidized NWs retain some fraction of their magnetizations, which would permit continued operation of the magnetic nanocomposite sensor indefinitely, albeit at a lower resolution, which may still be suitable for some purposes.

To sense forces using the magnetic nanocomposite sensor to, the magnetic sensor included therein must be characterized in order to obtain its sensitivity S (in the case of a GMI sensor, this sensitivity will be to as $S_{GMI}$). Characterization of an example GMI sensor can be accomplished, for example, by using a Helmholtz coil to apply a magnetic field from 0 Oe to 100 Oe with increments of 1 Oe to the GMI sensor. FIG. 8A shows the impedance of an example GMI sensor obtained with an impedance analyzer (e.g., an Agilent E4991A) at a current of 2 mA in amplitude and a frequency from 10 to 500 MHz. The example GMI sensor response shows a peak at a field of 11 Oe corresponding to the anisotropy field of the $Ni_{80}Fe_{20}$ thin film. The response of the example GMI sensor at 500 MHz and for fields applied in the longitudinal and transverse direction is shown in FIG. 8B. As can be seen, the example GMI sensor is magnetically sensitive in the longitudinal direction while no significant impedance change is observed in the transverse direction. The GMI ratio, which is the maximum impedance change obtained with respect to the impedance at saturation field, is 20% and 1.3% in the longitudinal and transverse direction, respectively. This anisotropic magnetic property of the example GMI sensor therefore provides a good selectivity in terms of the direction of the magnetic signal that is being measured. The value of $S_{GMI}$ can be estimated through a linear fit of a GMI sensor's response between 0 Oe and 11 Oe, as shown in FIG. 8B, which includes the operating range within which the magnetic fields vary as a result of deflection of the nanocomposite pillars. Because $S_{GMI}$ increases with increasing frequency (as shown in FIG. 8C), an example operating frequency of 500 MHz may be selected, which corresponds to an Saw of 0.67Ω/Oe.

Using the experimental setup shown in FIG. 9, the magnetic nanocomposite sensor can be tested by applying air and water volumetric flow rates using a syringe pump through a channel inlet in both sensitive and non-sensitive directions of the GMI sensor. The average flow velocity can be calculated by dividing the applied volumetric flow rate by the channel cross-section area of 10 mm². The impedance magnitude of the GMI sensor can be measured with the impedance analyzer at a current of 2 mA in amplitude and 500 MHz in frequency. Using the example described above, a set of 10 data points at every flow velocity value was recorded over a period of 30 seconds. The values for $Z_δ$ and $Z_f$ were obtained from the average value and the maximum deviation from the average value, respectively. The current dependence of the flow sensor was tested for current amplitudes between 0.1-10 mA, which are the limits of the impedance analyzer.

Computational Model

The response of an example magnetic nanocomposite sensor can be computed from equations (1) and (3) (both of which are described above). The response of the above-described embodiment having eight nanocomposite pillars was calculated using a Young's modulus of 270 kPa, a remanence magnetization of 2.1 memu and $S_{GMI}$=0.67Ω/Oe. The eight pillars were modeled by finite element simulations as three dimensional (3D) cylindrical beams, in order to study the magnetic fields affecting the GMI sensor upon the deflection of the nanocomposite pillars. The magnetic NWs were accounted for by assigning flux density vectors to the pillars, and the flux density vectors were calculated from the NWs' remanence value and the amount of NWs in the pillars. Fluid flow was simulated by rotating the pillars about the anchor point by the angle θ, which is related to the deflection by:

$$\delta = l \sin \theta. \quad (5)$$

This changes the effective area of the pillar that is facing the flow to:

$$A(\theta) = \frac{\pi D}{2} l \cos \theta. \quad (6)$$

The average value of the magnetic field at the GMI sensor is:

$$H_{mag}(\theta) = \frac{1}{n} \sum_{i=1}^{n} (H_x)_i, \quad (7)$$

where Hx is the component of the magnetic vector field along the GMI sensor's sensitive direction, i is the summation index and n is the number of magnetic vectors used in the averaging process. The average magnitude of the magnetic field is calculated as:

$$H_{mag}(\theta) = \frac{1}{n} \sum_{i=1}^{n} \left( \sqrt{H_x^2} \right)_i, \quad (8)$$

When the pillars are straight, an average magnetic vector field of 0 or Oe is obtained, due to symmetry of the stray field. However, the magnitude of the magnetic field in this case is 3.2 Oe, which can be considered as the bias field of the GMI sensor. As the pillars deflect, the stray field at the GMI sensor increases on one side of the pillar and decreases on the other side, causing the average magnetic field value to increase. When the pillars are fully deflected, the magnetic field reaches an average value of 1.3 Oe.

The value of $v_{avg}$ (δ) can be calculated by combining equation (4) with equation (3), where A(δ) can be derived from equation (5) and equation (6) as:

$$A(\delta) = \frac{\pi D}{2} \left( \frac{\delta}{\sin \theta} \right) \cos \theta = \frac{\pi D \delta}{2 \tan \theta}. \quad (9)$$

Based on the above, the magnetic nanocomposite sensor's impedance change can be calculated from equation (1) by relating H(δ) to the corresponding H(θ) and using the experimentally obtained $S_{GMI}$. In this regard, equation 1 illustrates that the impedance change of the GMI sensor depends on the sensitivity of the GMI sensor and the change in the magnetic field at the GMI sensor. This change in magnetic field, in turn, is caused by deflection of the pillars by fluid flow or, in a tactile embodiment, by touching of the pillars (the flow or touch applies a force to the pillars which causes the pillars to deflect). Increasing the velocity of the fluid flow (or the force of the touch) will increase the bending of the pillars and hence increase the magnetic field at the GMI sensor, which results in a change of the impedance of the GMI sensor.

The results of these experiments are shown in FIG. 10A (for air) and FIG. 10B (for water). The example sensor is sensitive to average air flow velocities from 0 to 190 mm/s with maximum values of S=24 mΩ/(mm/s) and a resolution (R) of 0.56 mm/s at a power consumption of 31.6 μW. In water, the example sensor operates in flow rates that range from 0 to 7.8 mm/s with maximum values of S=0.9Ω/(mm/s) and a resolution of 15 μm/s. When the power consumption is reduced to as little as 80 nW, a high resolution of 32 μm/s is still maintained. The range of flow rates is lower for water than for air, due to the higher density of water, which causes larger forces to be exerted on the pillars. In both cases, the response increases in a relatively linear manner (±5%) between 0 and 0.6 mm/s for water flow and between 0 and 18 mm/s for air flow, with the slopes representing the maximum sensitivity. Another linear region (±3%) is observed for water flow between 1.9 and 7.8 mm/s with S=13.5 mΩ/(mm/s), and between 40 and 190 mm/s with S=0.7 mΩ/(mm/s) for air. Completely bending the pillars results in saturating the impedance change at 0.53Ω and 0.54Ω for air and water flows, respectively.

The orientation of the fluidic channel with respect to the GMI sensor's alignment can be changed to test the flow sensor along the non-sensitive direction. When doing so using the example sensor described above, a smaller response of about 10% compared to the sensitive direction is obtained with the saturation values of 0.059Ω for air and 0.061 for water.

FIGS. 10A and 10B additionally show the theoretical response of the flow, which is in close agreement with the experimental results. A slightly higher saturation value of 5.7Ω is obtained from the theoretical model. This is most likely due to the actual magnetization of the pillars being lower than expected, indicating a lower NW concentration than expected. Theoretical impedance values at the knee region, which corresponds to around 70 degrees pillar deflection, are higher than the experimental values, due to the assumption of rotation of straight pillars rather than their bending and neglecting the fact that the actual flow velocity inside the channel is reducing toward the channel walls.

In some embodiments, as mentioned previously, these concepts may be used in the context of a fluid flow sensor or a tactile sensor element that can measure more than one property, such as determining the texture of the contacted object and the movement or stability of the objects, with easily modifiable performance. While the force detection principle is the same for a flow sensing embodiment and a tactile sensor embodiment, the force applied for a flow sensor is from the fluid flow and it is horizontally along the flow direction, while the force from a tactile sensor is due to the interaction with a surface or an object and can be a vertical force causing a buckling of the pillars or a horizontal force causing the pillars to deflect, or a combination of the two.

Based on the differential performance produced by differently designed pillars (such as those differences demonstrated below), in some embodiments multiple sensors may be used in combination to be responsive to a range of tactile forces. For instance, a first sensor element may include narrow diameter pillars and a magnetic sensor disposed on a substrate. These narrow diameter pillars may cause this first sensor element to be particularly sensitive to very slight forces. This first sensor element may be adjacent to (or may be surrounded by) additional sensor elements disposed on the substrate that have respective magnetic sensors and differently shaped pillars (which are responsive to forces having larger or smaller magnitudes than the pillars of the first sensor element). In combination, the first sensor element and the additional sensor elements can provide additional data regarding the magnitude or direction of the touch, or an increased range of detectable forces. Similarly, using an array of sensor elements, it may be possible to utilize the different impedance changes produced by the various sensor elements to determine an angle from which the touch was applied or the shape of an object touching the array of sensor elements.

The tactile sensor element described herein allows the detection of forces between 0-106 μN applied to each pillar, which corresponds to a pressure range of 0-1.35 kPa with a resolution of 0.2 kPa. However, changing the diameter to 500 μm increases the operation range to 0-66.3 mN applied to each pillar that corresponds to pressure range of 0-169 kPa and a resolution of 1.3 kPa.

The performance of the magnetic nanocomposite sensor can be modified easily by changing the mechanical parameters of the pillars, as discussed previously. Changing the diameter of the pillars, for example, leads to a different operating range, resolution and sensitivity. To demonstrate this point, a magnetic nanocomposite sensor was fabricated with 500 μm long and 250 μm in diameter nanocomposite pillars that have the same iron NWs volume as the 100 μm pillars. The modified sensor operates in the range from 0 to 12 mm/s with maximum values of S=0.17Ω/(mm/s) and R=79 μm/s, as shown in FIG. 11.

The average power consumption of this modified magnetic nanocomposite sensor, when operated at 2 mA current amplitude, is 31.6 μW. The power consumption can be further reduced by operating the magnetic nanocomposite sensor at lower current amplitudes. The current dependence of this modified flow sensor is shown in FIG. 12. As can be seen, there is almost no influence of the current on the measured impedance value, with slightly higher values obtained at low current amplitudes. The impedance of the GMI sensor at 2 mA driving current has fluctuations of Zf=0.0135Ω, while Zf=0.0292Ω and Zf=0.0096Ω at 0.1 mA and 10 mA, respectively. This indicates that the signal stability can be enhanced by increasing the driving current, and hence increasing the resolution at the expense of power consumption. The operation at 10 mA leads to a slightly improved resolution of 10 μm/s at a power consumption of 790 μW. When operated at 0.1 mA, the power consumption can be reduced to as little as 80 nW, with the resolution still being 32 μm/s. As disclosed herein, embodiments of the present invention may use nanocomposite pillars (consisting, for example, of PDMS polymer with embedded iron nanowires) to mimic natural cilia. The nanocomposite pillars can be permanently magnetic yet have a high elasticity. They are integrated on a sensor (e.g., a GMI thin film sensor) to detect the change in the nanocomposite pillars' stray fields that results from bending in response to the application of a force (e.g., fluid flow or tactile contact). The magnetic nanocomposite sensor device can be used for both water and air flow measurement applications, and has an operating range in case of air flow between 0 and 190 mm/s with a sensitivity up to 24 mΩ/(mm/s) and a resolution of 0.56 mm/s, and in case of water flow the operating range is between 0 and 7.8 mm/s with a sensitivity up to 0.9Ω/(mm/s) and a resolution of 15 μm/s. This resolution is significantly higher than traditional flow sensors and is accomplished with a very low power consumption of 31.6 μW (compared to reported thermal flow sensors with 177 μW11 or hair flow sensors with 140 μW). The power consumption can even be reduced to 80 nW, with only a small decrease of the resolution of water flow to 32 μm/s. A tactile sensor magnetic nanocomposite sensor developed using the same concept was, for example, able to detect a pressure range of 0-169 kPa with a resolution of up to 1.3 kPa.

The magnetic NWs-based flow sensor proposed by Hein et al. offers the advantage of extremely small dimensions but suffers from the possibility of corrosion, and the high stiffness that prevents detection of low flow velocities. In contrast, embodiments disclosed herein demonstrate good corrosion resistance, are highly elastic, and use a simple and cost-effective fabrication method compared with a conventional soft lithography process that demands templates prepared in specialized facilities with expensive consumables.

Eight nanocomposite pillars were used in the example magnetic nanocomposite sensor described herein, and these nanocomposite pillars were arranged in a manner allowing full deflection of each pillar without touching each other. This design provides an average signal over a length of 8 mm, but can be readily adjusted to meet other requirements, as should be appreciated based on the above description. This modifiability has been demonstrated by modifying the pillars' diameter from 100 μm to 250 which increased the flow velocity range at the cost of sensitivity and resolution. Performance can be further improved by optimizing the sensitivity of the GMI sensor, which showed a rather small GMI ratio in the particular example illustrated above.

As noted previously, it should be appreciated that other magnetic field sensors can be used in place of the GMI sensor, such as a giant magnetoresistance (GMR) sensor or a magnetic tunnel junctions, and one having ordinary skill in the art would appreciate that for some applications these other sensors might offer certain advantages. However, advantages of the GMI sensor include its simple fabrication, robustness, and the possibility of wireless operation. In addition, sensors (such as the GMI and GMR sensors) that offer a degree of flexibility unlock additional benefits provided by embodiments of the present invention.

FIG. 13 illustrates a system utilizing an example of the above-described magnetic nanocomposite sensor. In this illustration, magnetic nanocomposite sensor 1302 may be disposed on a substrate, such as a wearable device, a biomedical device, a robotic device, or any number of other flexible substrates. For instance, smart skins and electronic skins try to mimic the tactile sensitivity of human skins for future robotics or prosthesis applications and may benefit for application of the magnetic nanocomposite sensors described herein. In some embodiments, a rigid substrate may be used.

The magnetic nanocomposite sensor 1302 may in turn be in communication with a computing device 1300 having a processor 1304, a memory 1306, a user interface 1308, and a communication circuitry 1310. In this regard, the computing device 1300 may be physically connected to the magnetic nanocomposite sensor 1302, or alternatively may be in wireless communication therewith, as explained below. In some embodiments, the computing device 1300 may be configured to communicate with a plurality of magnetic nanocomposite sensors 1302.

The processor 1304 may include one or more processing devices, and the memory 1306 may be a non-transitory electronic storage device (e.g., a computer readable storage medium) comprising one or more volatile and/or non-volatile memories. The memory 1306 may be configured to store instructions, that, when executed by the processor 1304, cause the computing device 1300 to carry out various functions in accordance with example embodiments of the present invention. For instance, these functions may comprise requests to interrogate and/or retrieve information regarding the impedance of the magnetic nanocomposite sensor 1302, or requests to utilize such information to perform responsive action or to alert a user. Examples of such responsive action may include interpreting the impedance measurements of the one or more magnetic nanocomposite sensors 1302 to generate an indication of a flow rate and/or force applied to a magnetic nanocomposite sensor 1302.

The user interface 1308 may comprise one or more devices (e.g., a mouse, keyboard, microphone, display, and/or the like) that enable a user to communicate with and/or provide instructions to the computing device 1300. The user may in some embodiments comprise another computing device that controls the computing device 1300, although in many cases the user interface 1308 may be designed to communicate with a person.

Finally, the communication circuitry 1310 may comprise a network interface that enables the computing device 1300 to communicate with (and direct operation of) the magnetic nanocomposite sensor 1302. In this regard, the communication circuitry 1310 may include a wired (or otherwise physical) connection to the magnetic nanocomposite sensor. However, in embodiments where a physical connection would be impractical, the magnetic nanocomposite sensor 1302 may communicate with communication circuitry 1310 via a wireless connection. To this end, an example GMI sensor utilized in the magnetic nanocomposite sensor 1302 may comprise a passive sensor that does not require connection to a power source, and which operates at frequencies that are available for commercial use. For instance, communication circuitry 1310 can wirelessly interrogate the magnetic nanocomposite sensor 1302 at, for instance, an unallocated portion of the spectrum, such as 433 MHz or 2.41 GHz (it should be understood that other portions of the spectrum may be used in addition or alternative). Utilizing the GMI sensor and a surface acoustic wave (SAW) transponder as described by Li et al. (referenced above), the communication interface 1310 receives a reflected signal from the antenna containing an indication of the impedance sensed by the GMI sensor. Once received, the computing device 1300 may calculate the nature of the force(s) acting upon the magnetic nanocomposite sensor, such as by determining a pressure and/or flow rate associated with an air or liquid flow, or by determining a size or location or other relevant property associated with a tactile force applied to the magnetic nanocomposite sensor 1302.

Utilizing a wireless connection as described directly above, the magnetic nanocomposite sensor 1302 does not require a local power source, as the necessary operative force is caused by the interrogation of the GMI sensor itself. More broadly, maintenance of magnetic nanocomposite sensors can become an efficient process. For example, wireless magnetic nanocomposite sensors may be deployed, for example, at the fingertips of a prosthetic hand. As the nanocomposite pillars of an example magnetic nanocomposite sensor oxidize and/or otherwise degrade (due, for example, to repeated and/or harsh use), these portions can be manually replaced (in the manner of a contact lens, for example), while the remaining elements of the magnetic nanocomposite sensor (e.g., the GMI sensor itself and the underlying substrate) remain intact on the prosthesis. In this regard, upkeep of the sensory capabilities of the magnetic nanocomposite sensor can be simple and cheap.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A magnetic nanocomposite device comprising:
   a flexible substrate;
   a set of nanocomposite pillars having magnetic nanowires embedded therein in a composite material, the magnetic nanowires creating a stray field; and
   a flexible magnetic sensor disposed on the substrate, the magnetic sensor configured to detect the stray field created by the magnetic nanowires, wherein
   the set of nanocomposite pillars are directly located, with a first end, on a face of the magnetic sensor, and a second end, opposite the first end, of the pillars is free to move for detecting a force applied to the second end.

2. The magnetic nanocomposite device of claim 1, wherein the magnetic sensor comprises a magnetic tunnel junction sensor.

3. The magnetic nanocomposite device of claim 1, wherein the magnetic sensor is magnetically anisotropic.

4. The magnetic nanocomposite device of claim 1, further comprising one or more additional magnetic sensors.

5. The magnetic nanocomposite device of claim 1, wherein the magnetic sensor comprises a giant magnetoimpedance (GMI) sensor whose impedance is affected by the stray field.

6. The magnetic nanocomposite device of claim 5, wherein the GMI sensor further includes a wireless transponder configured to transmit information regarding the impedance of the GMI sensor.

7. The magnetic nanocomposite device of claim 1, wherein the magnetic sensor comprises a giant magnetoresistance (GMR) sensor.

8. The magnetic nanocomposite device of claim 1, wherein the nanocomposite pillars further comprise a PDMS or SU-8 polymer.

9. The magnetic nanocomposite device of claim 1, wherein each nanocomposite pillar of the set of nanocomposite pillars is configured to deflect in an instance in which a force is applied thereto, wherein deflection of a particular nanocomposite pillar of the set of nanocomposite pillars causes a change in the stray field.

10. The magnetic nanocomposite device of claim 1, wherein the set of nanocomposite pillars is disposed on the magnetic sensor.

11. The magnetic nanocomposite device of claim 1, wherein the magnetic sensor is located within a proximity of the set of nanocomposite pillars that enables the magnetic sensor to detect a stray field associated with nanowires embedded in each nanocomposite pillar of the set of nanocomposite pillars.

12. The magnetic nanocomposite device of claim 1, wherein the magnetic nanowires comprise at least one of iron, cobalt, nickel, or iron gallium.

13. The magnetic nanocomposite device of claim 1, further comprising a computing system configured to:
receive an indication of a change in impedance measured by the magnetic sensor; and
estimate a magnitude of a force applied to at least a subset of the set of nanocomposite pillars based on the change in impedance.

14. The magnetic nanocomposite device of claim 1, wherein the magnetic nanocomposite device is configured to transmit an indication of the change in impedance measured by the magnetic sensor to a computing system.

15. The magnetic nanocomposite device of claim 14, wherein the magnetic nanocomposite device is configured to transmit the indication of the change in impedance measured by the magnetic sensor to the computing system via wireless transmission.

16. The magnetic nanocomposite device of claim 1, wherein the substrate comprises a flexible substrate, and wherein the magnetic sensor comprises a flexible magnetic sensor.

17. A method comprising:
providing a magnetic nanocomposite device having a flexible substrate, a set of nanocomposite pillars having magnetic nanowires embedded therein in a composite material, the magnetic nanowires creating a stray field, and a flexible magnetic sensor disposed on the substrate and configured to detect the stray field created by the magnetic nanowires;
determining, in response to application of a force to a subset of the set of nanocomposite pillars, a change in impedance of the magnetic sensor; and
determining, based on the change in impedance of the magnetic sensor, information regarding the application of the force,
wherein the application of the force to the subset of the set of nanocomposite pillars causes nanocomposite pillars in the subset to bend,
wherein bending of the nanocomposite pillars in the subset causes a change in the stray field,
wherein the change in the stray field causes the change in the impedance of the magnetic sensor, and
wherein the set of nanocomposite pillars is directly located, with a first end, on a face of the magnetic sensor, and a second end, opposite the first end, of the pillars is free to move for detecting a force applied to the second end.

18. The method of claim 17, wherein the information comprising the application of the force comprises an average flow velocity of a fluid causing the application of the force.

19. The method of claim 17, wherein determining the information comprising the application of the force comprises determining that the magnetic nanocomposite device has been touched.

20. The method of claim 17, wherein the substrate comprises a flexible substrate, and wherein the magnetic sensor comprises a flexible magnetic sensor.

* * * * *